(12) United States Patent
Luthi et al.

(10) Patent No.: US 11,957,066 B2
(45) Date of Patent: Apr. 9, 2024

(54) STACKABLE IN-LINE FILTER MODULES FOR QUANTUM COMPUTING

(71) Applicant: Intel Corporation, Santa Clara, CA (US)

(72) Inventors: Florian Luthi, Portland, OR (US); Lester Lampert, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 983 days.

(21) Appl. No.: 16/560,184

(22) Filed: Sep. 4, 2019

(65) Prior Publication Data
US 2021/0066570 A1    Mar. 4, 2021

(51) Int. Cl.
*H10N 60/80* (2023.01)
*G06N 10/00* (2022.01)
(Continued)

(52) U.S. Cl.
CPC ........... *H10N 60/805* (2023.02); *G06N 10/00* (2019.01); *H01B 12/02* (2013.01); *H10N 60/12* (2023.02);
(Continued)

(58) Field of Classification Search
CPC .............................. H10N 60/805; G06N 10/00
See application file for complete search history.

(56) References Cited

U.S. PATENT DOCUMENTS 10,978,425 B2 *  4/2021  White .................... H01L 24/05
2012/0074386 A1   3/2012  Rachmady et al.
(Continued)

FOREIGN PATENT DOCUMENTS

WO    2017155531 A1    9/2017
WO    2017213638 A1    12/2017
(Continued)

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

*Primary Examiner* — Paul A Wartalowicz
(74) *Attorney, Agent, or Firm* — Akona IP PC

(57) ABSTRACT

Embodiments of the present disclosure describe quantum circuit assemblies that include one or more filter modules integrated in a package with a quantum circuit component having at least one qubit device. Integration may be such that both the quantum circuit component and the filter module(s) are at least partially inside a chamber formed by a radiation shield structure that is configured to attenuate electromagnetic radiation incident on the quantum circuit component and the filter module(s). Placing filter modules under the protection provided by the radiation shield structure may boost coherence of the qubits. Some example filter modules may include filter(s) configured to convert electromagnetic radiation to heat and filter(s) configured to perform bandpass filtering. Modular blocks of in-line filters inside the shielded environment may allow to route signals to the quantum circuit component with reduced noise and speed up installation of a complete quantum computer.

20 Claims, 13 Drawing Sheets

(51) Int. Cl.
  *H01B 12/02* (2006.01)
  *H10N 60/10* (2023.01)
  *H10N 60/12* (2023.01)
  *H10N 60/81* (2023.01)

(52) U.S. Cl.
  CPC ......... *H10N 60/128* (2023.02); *H10N 60/815* (2023.02)

(56) References Cited

U.S. PATENT DOCUMENTS

| | | |
|---|---|---|
| 2013/0264617 A1 | 10/2013 | Joshi et al. |
| 2019/0006572 A1 | 1/2019 | Falcon et al. |
| 2019/0042964 A1 | 2/2019 | Elsherbini et al. |
| 2019/0042967 A1 | 2/2019 | Yoscovits et al. |
| 2019/0042968 A1 | 2/2019 | Lampert et al. |
| 2019/0043822 A1 | 2/2019 | Falcon et al. |
| 2019/0043919 A1 | 2/2019 | George et al. |
| 2019/0043951 A1 | 2/2019 | Thomas et al. |
| 2019/0043952 A1 | 2/2019 | Thomas et al. |
| 2019/0043953 A1 | 2/2019 | George et al. |
| 2019/0043955 A1 | 2/2019 | George et al. |
| 2019/0043968 A1 | 2/2019 | Lampert et al. |
| 2019/0043973 A1 | 2/2019 | George et al. |
| 2019/0043974 A1 | 2/2019 | Thomas et al. |
| 2019/0043975 A1 | 2/2019 | George et al. |
| 2019/0043989 A1 | 2/2019 | Thomas et al. |
| 2019/0044044 A1 | 2/2019 | Lampert et al. |
| 2019/0044045 A1 | 2/2019 | Thomas et al. |
| 2019/0044046 A1 | 2/2019 | Caudillo et al. |
| 2019/0044047 A1 | 2/2019 | Elsherbini et al. |
| 2019/0044048 A1 | 2/2019 | George et al. |
| 2019/0044049 A1 | 2/2019 | Thomas et al. |
| 2019/0044050 A1 | 2/2019 | Pillarisetty et al. |
| 2019/0044051 A1 | 2/2019 | Caudillo et al. |
| 2019/0044066 A1 | 2/2019 | Thomas et al. |
| 2019/0044668 A1 | 2/2019 | Elsherbini et al. |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |
| 2019/0392352 A1 | 12/2019 | Lampert |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |
| WO | 2019055038 A1 | 3/2019 |
| WO | 2019066840 A1 | 4/2019 |
| WO | 2019066843 A1 | 4/2019 |
| WO | 2019117883 A1 | 6/2019 |
| WO | 2019117929 A1 | 6/2019 |
| WO | 2019117930 A1 | 6/2019 |
| WO | 2019117972 A1 | 6/2019 |
| WO | 2019117973 A1 | 6/2019 |
| WO | 2019117974 A1 | 6/2019 |
| WO | 2019117975 A1 | 6/2019 |
| WO | 2019117977 A1 | 6/2019 |
| WO | 2019125348 A1 | 6/2019 |
| WO | 2019125423 A1 | 6/2019 |
| WO | 2019125456 A1 | 6/2019 |
| WO | 2019125498 A1 | 6/2019 |
| WO | 2019125499 A1 | 6/2019 |
| WO | 2019125500 A1 | 6/2019 |
| WO | 2019125501 A1 | 6/2019 |
| WO | 2019132963 A1 | 7/2019 |
| WO | 2019133027 A1 | 7/2019 |
| WO | 2019135769 A1 | 7/2019 |
| WO | 2019135770 A1 | 7/2019 |
| WO | 2019135771 A1 | 7/2019 |

OTHER PUBLICATIONS

"A two-qubit logic gate in silicon," Veldhorst et al., Nature, vol. 526, Oct. 15, 2015, pp. 410-414.

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"Independent, extensible control of same-frequency superconducting qubits by selective broadcasting," Asaad et al., Netherlands Organisation for Applied Scientific Research, Aug. 28, 2015, 17 pages.

"Fast sensing of double-dot charge arrangement and spin state with an rf sensor quantum dot," Barthel et al, Materials Department, University of California, Santa Barbara, Jan. 16, 2014, 4 pages.

(56) References Cited

OTHER PUBLICATIONS

"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Surface loss simulations of superconducting coplanar waveguide resonators," Wenner et al, Applied Physics Letters 99, 113513 (2011), pp. 113513-1 through 113513-3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 043513-3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 052113-3.
"Photon- and phonon-assisted tunneling in the three-dimensional charge stability diagram of a triple quantum dot array," Braakman et al., Applied Physics Letters 102, 112110 (2013), pp. 112110-1 through 112110-4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 113104-3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.
U.S. Appl. No. 16/013,384, filed Jun 20, 2018, Quantum Circuit Assemblies With Triaxial Cables.
U.S. Appl. No. 16/450,396, filed Jun. 24, 2019, Integrated Quantum Circuit Assemblies for Cooling Apparatus.

* cited by examiner

STACKABLE IN-LINE FILTER MODULES FOR QUANTUM COMPUTING

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence. Providing appropriately filtered signals to quantum circuit components with such qubits is not a trivial task and further improvements would be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
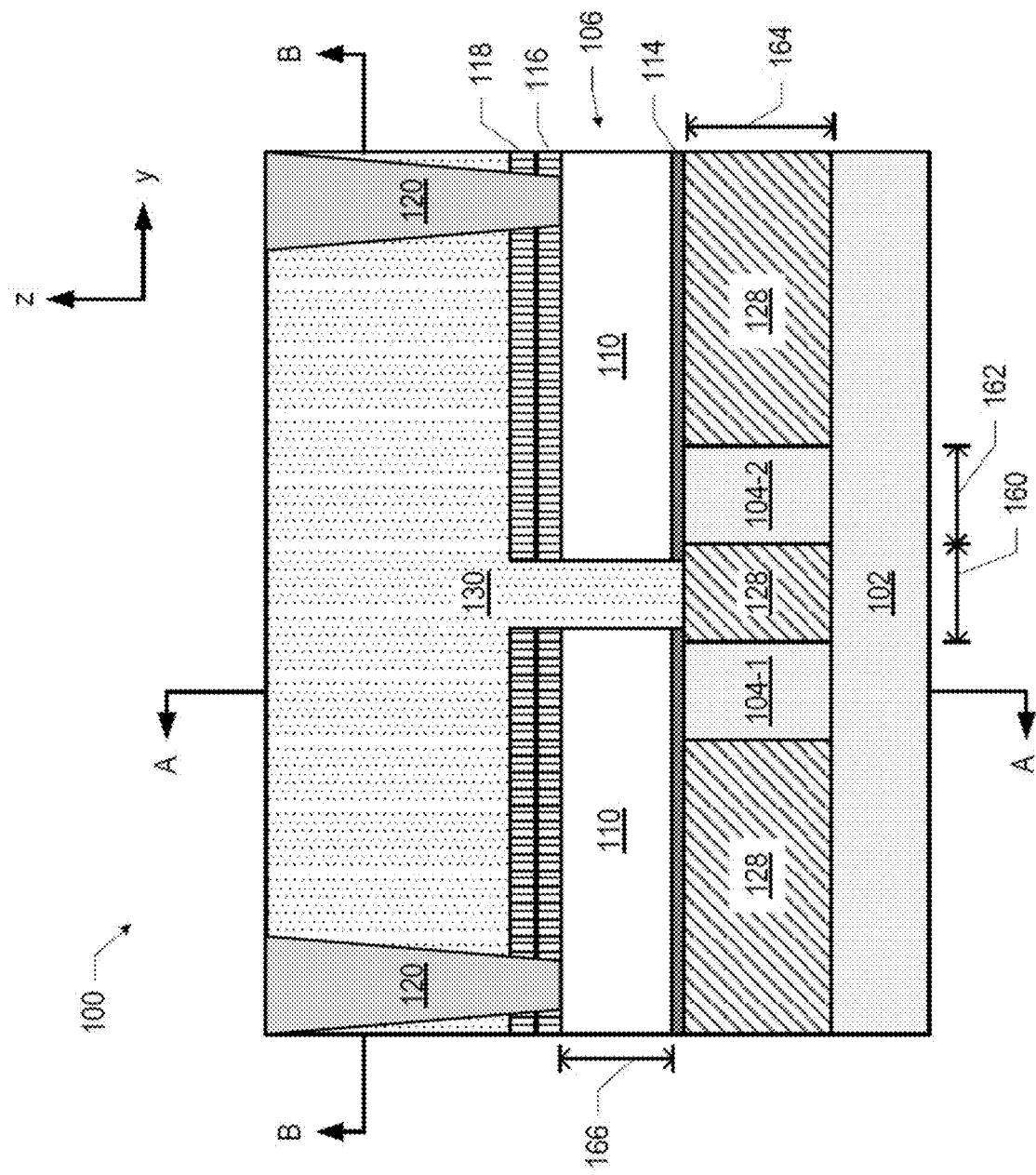
FIGS. 1-3 are cross-sectional views of an example device implementing quantum dot qubits, according to some embodiments of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. So for example, two entangled qubits are now represented by a superposition of 4 quantum states, and N entangled qubits are represented by a superposition of $2^N$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e. by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e. computers that use phenomena of classical physics). Furthermore, as briefly described above, for the reason of protecting fragile qubits from decoherence, they are often operated at cryogenic temperatures by being placed in a suitable cooling apparatus, e.g., a dilution refrigerator. This raises challenges from accurate estimation and control of the temperatures to providing various signals to qubit devices which must be kept at such low temperatures.

None of the challenges described above ever had to be addressed for classical computers, and these challenges are not easy. In particular, filtering signals that may be provided to the quantum circuit components that include at least one, but typically a plurality, of qubit devices (or, simply, qubits), to operate within a cooling apparatus is far from trivial. For example, filtering of radio frequency (RF) (e.g., microwave) lines is typically done outside of the innermost radiation shield structure that typically encloses a quantum circuit component, but doing so may expose both the RF lines and the filters to sources of radiation, e.g., thermal background. In another example, the signals may be brought to the quantum circuit component via coaxial cables into the shielding environment, but then the coaxial cables act as antennae for noise inside the shielded environment. Another challenge resides in each signal line having to be connected individually to sample connectors leading to the quantum circuit component. Overall, current approaches to building quantum circuit assemblies are often such that filters outside the shielded environment lead to compromised performance, individual routing of cables is error prone, and every setup has a different effective shielding environment.

Embodiments of the present disclosure describe quantum circuit assemblies that include one or more filter modules integrated in a package with a quantum circuit component having at least one qubit device (herein, the terms "qubit device" and "qubit" may be used interchangeably). In particular, integration may be such that both the quantum circuit component and the one or more filter modules are at least partially inside a chamber formed by a radiation shield structure that is configured to attenuate electromagnetic radiation incident on (e.g., in the vicinity of) the quantum circuit component and the one or more filter modules. Placing one or more filter modules under the protection provided by the radiation shield structure may boost coherence of the qubits. One example filter module may include one or more filters configured to convert electromagnetic radiation to heat. Another example filter module may include one or more filters configured to perform bandpass filtering, where, as used herein, the term "bandpass filter" is intended to include low-pass and high-pass filters because those filters filter low and high bands, respectively. Some filter modules may include different filters in a single module, e.g., at least one filter configured to convert electromagnetic radiation to heat and at least one filter configured to perform bandpass filtering. In various embodiments, filter modules may be interchangeable to account for custom needs. Multiple filter modules may be stackable over one another, e.g., in a line of a signal path between external electronics and the quantum circuit component and, therefore, such filter modules may be referred to as "stackable in-line filter modules." In various embodiments, the signal path may support propagation of RF and direct current (DC) signals, as needed to interconnect various ones of the external electronics and quantum circuit components. In some embodiments, one or more stackable in-line filter modules may be pre-packaged, or integrated, with some other electronic components and mechanical attachment means for easy inclusion within a cooling apparatus (e.g., a cryogenic refrigeration system such as a dilution refrigerator). In some embodiments, one or more stackable in-line filter modules may be integral (i.e., included as a part of a whole, rather than supplied separately) to the package. Modular blocks of in-line filters inside the shielded environment may allow to route signals to the quantum circuit component with reduced noise, compared to some conventional implementations. In some embodiments, the quantum circuit component may be mounted at the bottom of the filter stack, e.g., in a standardized manner. Such an integrated assembly may significantly speed up installation of a complete quantum computer because multiple components, possibly with the necessary routing between them, may be transferred from one system to another as a whole. For example, they may be placed into, and taken out from, a cooling apparatus at once, as a whole. As a result, such an integrated assembly may help develop systems for rapidly bringing up quantum computers, enable sharing of quantum hardware between different institutions, and develop into a standard product.

In various embodiments, quantum circuit component(s) integrated with one or more stackable in-line filter modules within a package of an integrated quantum circuit assembly, e.g., for inclusion within a cooling apparatus, as described herein may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

Some descriptions are provided with reference to quantum dot qubits and to superconducting qubits, in particular to transmons, a particular class of superconducting qubits. However, at least some teachings of the present disclosure may be applicable to implementations of quantum circuit components with any qubits, e.g., including superconducting qubits other than transmons and/or including qubits other than superconducting qubits and quantum dot qubits, which may be integrated within a package with one or more stackable in-line filter modules described herein, all of which implementations being within the scope of the present disclosure. Furthermore, in some embodiments, the quantum circuit components described herein may implement hybrid semiconducting-superconducting quantum circuits.

In order to provide substantially lossless connectivity to, from, and between the qubits, some or all of the electrically conductive portions of quantum circuit assemblies described herein, in particular various conductors or cables described herein (e.g., conductors or cables integrated within a package of an integrated quantum circuit assembly for inclusion within a cooling apparatus), as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, if used, the terms "oxide," "carbide," "nitride," etc., refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g. "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range of the RF spectrum is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Integrated Quantum Circuit Assemblies with Various Types of Qubits

As described above, the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those made using quantum dots (e.g., spin qubits and charge qubits), superconducting qubits (e.g. flux qubits or transmon qubits, the latter sometimes simply referred to as "transmons"), photon polarization qubits, single trapped ion qubits, etc. To indicate that these devices implement qubits, sometimes these devices are referred to as qubits, e.g. quantum dot qubits, superconducting qubits, etc.

Figure 13:
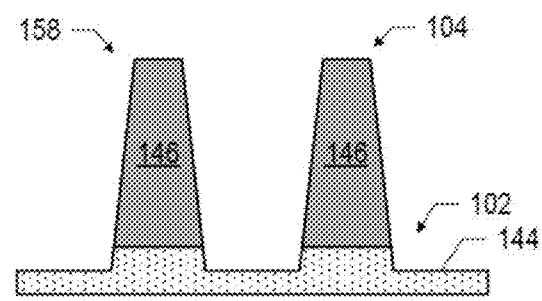
Figure 14:
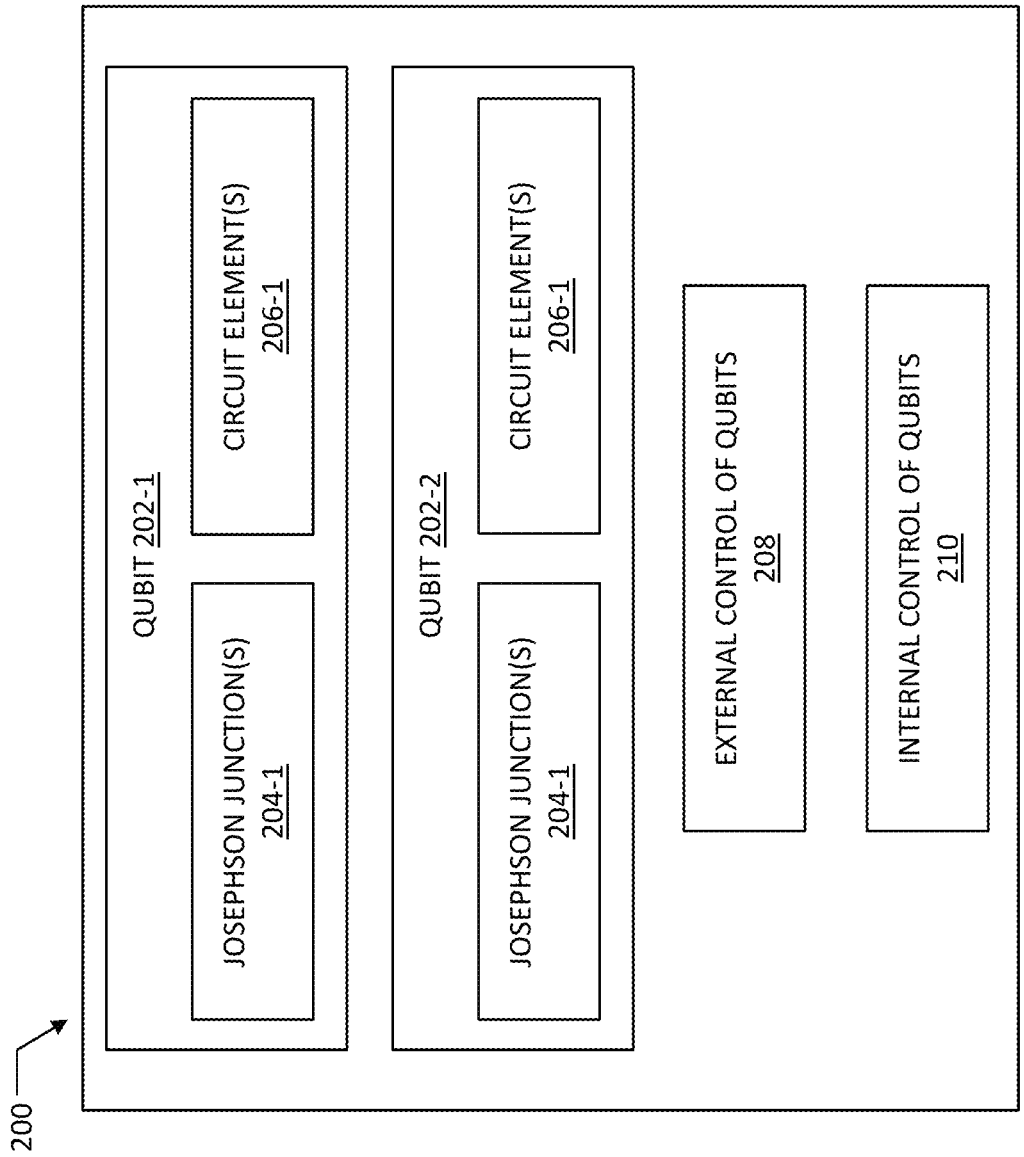
FIG. 14 provides a schematic illustration of an example device implementing superconducting qubits, according to some embodiments of the present disclosure.
Figure 15:
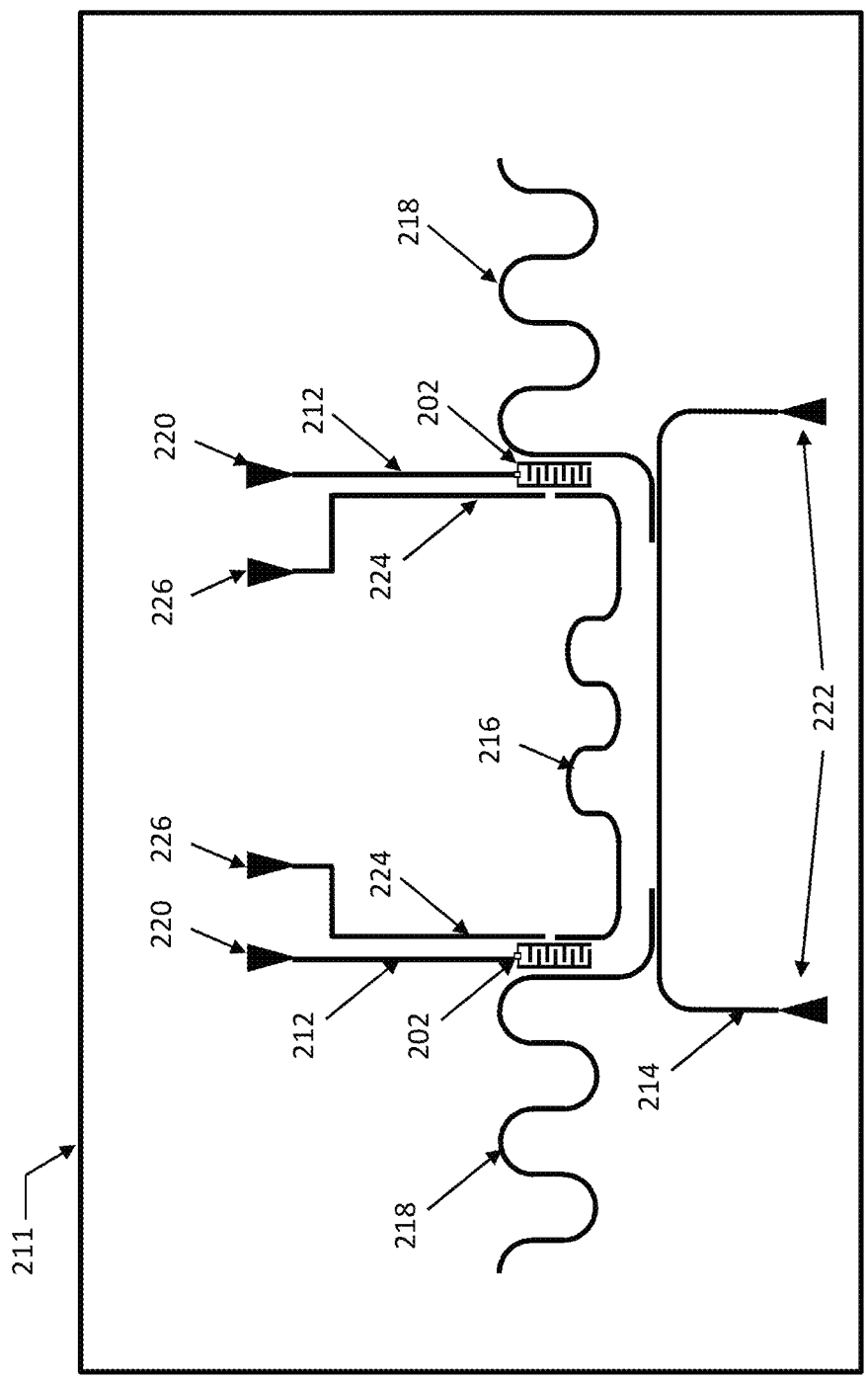
FIG. 15 provides a schematic illustration of an example physical layout of a device implementing superconducting qubits, according to some embodiments of the present disclosure.

The type of qubits used in a quantum circuit component would affect what types of signals are to be provided to or received from a package described herein in which such a quantum circuit component is integrated with one or more stackable in-line filter modules as described herein. Below, two example quantum circuit components are described—one incorporating quantum dot qubits (FIGS. 1-13) and one incorporating superconducting qubits (FIGS. 14-15). However, because the one or more stackable in-line filter modules as described herein are, in general, agnostic to the type of qubits being implemented, integration of quantum circuit components with one or more stackable in-line filter modules as described herein is applicable to quantum circuit components that include any type of qubits, all of which being within the scope of the present disclosure.

Example Quantum Circuit Components with Quantum Dot Qubits

Quantum dot devices may enable the formation of quantum dots to serve as quantum bits (i.e. as qubits) in a quantum computing device. One type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this is the type of a qubit device that is described as a first example of a qubit device that may be used in a quantum circuit component to be integrated in a package with one or more filter modules such that both the quantum circuit component and the one or more filter modules are at least partially inside a chamber formed by a radiation shield structure, according to some embodiments of the present disclosure.

Figure 2:
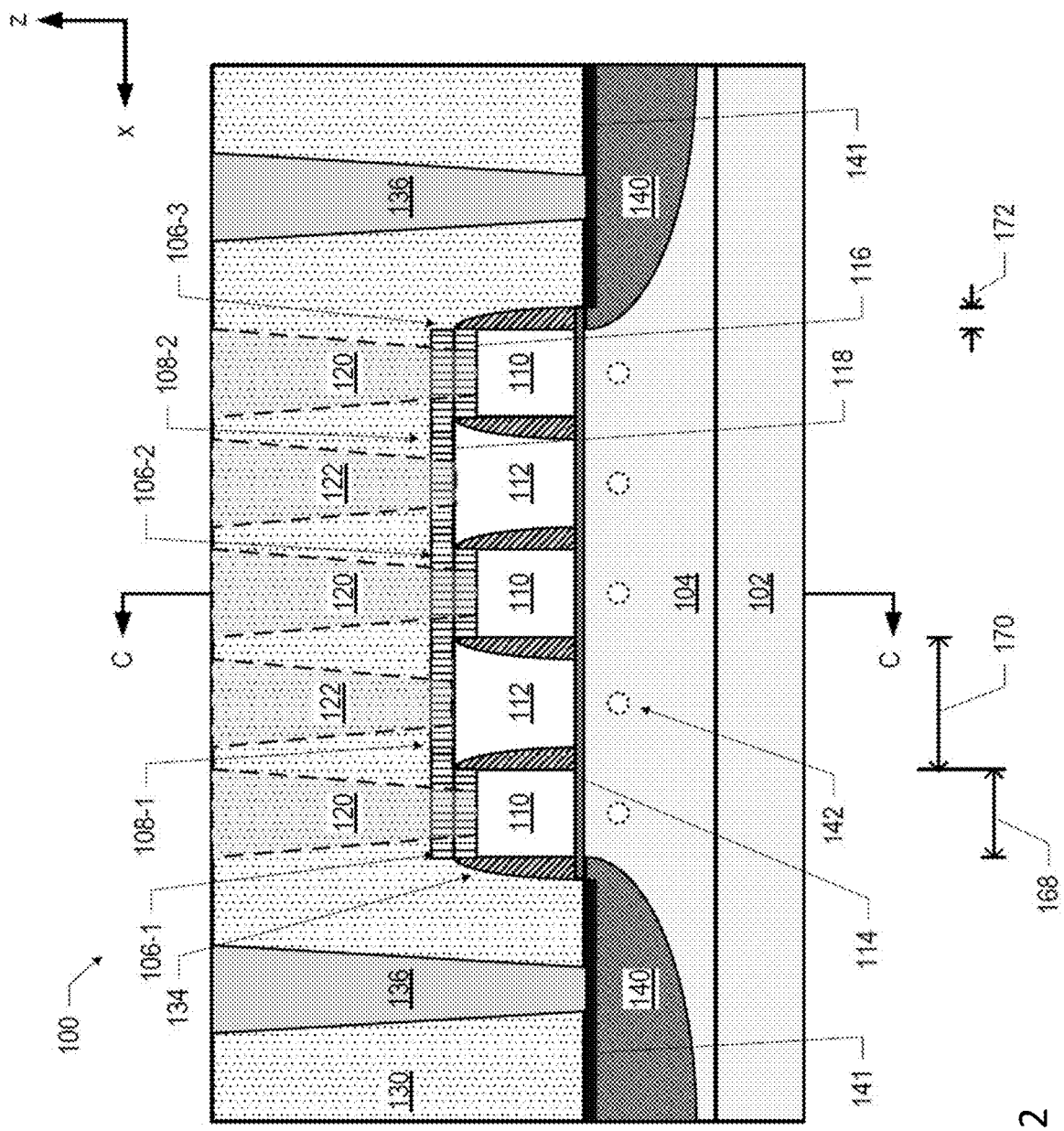
Figure 3:
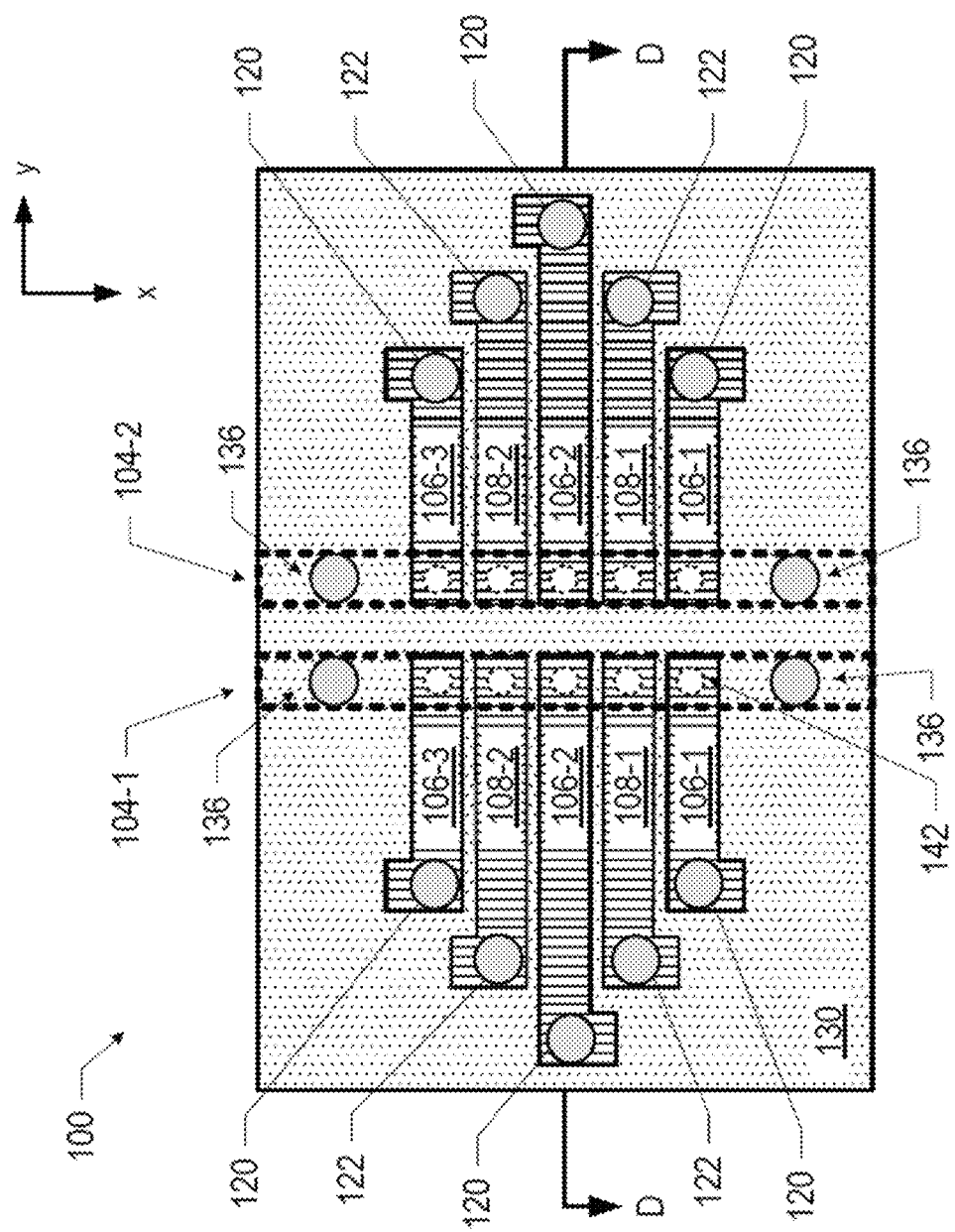

FIGS. 1-3 are cross-sectional views of an example quantum dot device 100 implementing quantum dot qubits, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 (while FIG. 1 illustrates a quantum dot device 100 taken along the section D-D of FIG. 3). Although FIG. 1 indicates that the cross-section illustrated in FIG. 2 is taken through the fin 104-1, an analogous cross-section taken through the fin 104-2 may be identical, and thus the discussion of FIGS. 1-3 refers generally to the "fin 104." A quantum circuit component to be integrated in a package with one or more filter modules, as described herein, may include one or more of the quantum dot devices 100.

As shown in FIGS. 1-3, the quantum dot device 100 may include a base 102 and multiple fins 104 extending away from the base 102. The base 102 and the fins 104 may include a semiconductor substrate and a quantum well stack (not shown in FIGS. 1-3, but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer of the quantum well stack (discussed below with reference to the quantum well layer 152 of FIGS. 4-6). Examples of base/fin arrangements are discussed below with reference to the base fin arrangements 158 of FIGS. 7-13.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to about 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 microns.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, multiple groups of gates like the gates illustrated in FIG. 2 may be disposed on the fin 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114. In the embodiment illustrated in FIG. 2, the gate dielectric 114 for all of the gates 106/108 is provided by a common layer of gate dielectric material. In other embodiments, the gate dielectric 114 for each of the gates 106/108 may be provided by separate portions of gate dielectric 114. In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 2, the hardmask 118 may extend over the hardmask 116 (and over the gate metal 110 of the gates 106), while in other embodiments, the hardmask 118 may not extend over the gate metal 110 (e.g., as discussed below with reference to FIG. 45). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108 may extend between the proximate spacers 134 on the sides of the gate 106-1 and the gate 106-3, as shown in FIG. 2. In some embodiments, the gate metal 112 may extend between the spacers 134 on the sides of the gate 106-1 and the gate 106-3. Thus, the gate metal 112 may have a shape that is substantially complementary to the shape of the spacers 134, as shown. In some embodiments in which the gate dielectric 114 is not a layer shared commonly between the gates 108 and 106, but instead is separately deposited on the fin 104 between the spacers 134 (e.g., as discussed below with reference to FIGS. 40-44), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIG. 2, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130.

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104, forming what may be referred to as a "quantum dot array." The location of the quantum dots 142 in FIG. 2 is not intended to indicate a particular geometric positioning of the quantum dots 142. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable material; for example, in embodiments in which the doped region 140 includes silicon, the interface material 141 may include nickel silicide.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, and/or silicon oxynitride. As known in the art of IC manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

Although not specifically shown in FIGS. 1-3, the quantum dot device 100 may further include one or more accumulation gates used to form a 2DEG in the quantum well area between the area with the quantum dots and the reservoir such as e.g. the doped regions 140 which, as previously described, may serve as a reservoir of charge carriers for the quantum dot device 100. Using such accumulation gates may allow to reduce the number of charge carriers in the area adjacent to the area in which quantum dots are to be formed, so that single charge carriers can be transferred from the reservoir into the quantum dot array. In various embodiments, an accumulation gate may be implemented on either side of an area where a quantum dot is to be formed.

Although also not specifically shown in FIGS. 1-3, some implementations of the quantum dot device 100 further include or are coupled to a magnetic field source used for spin manipulation of the charge carriers in the quantum dots. In various embodiments, e.g. a microwave transmission line or one or more magnets with pulsed gates may be used as a magnetic field source. Once a quantum dot array is initialized by ensuring that a desired number of charge carriers are present in each quantum dot and ensuring the initial spins of these charge carriers, spin manipulation may be carried out with either a single spin or pairs of spin or possibly larger numbers of spins. In some embodiments, single spins may be manipulated using electron spin resonance with a rotating magnetic field (perpendicular to its static field) and on resonance with the transition energy at which the spin flips.

Figure 4:
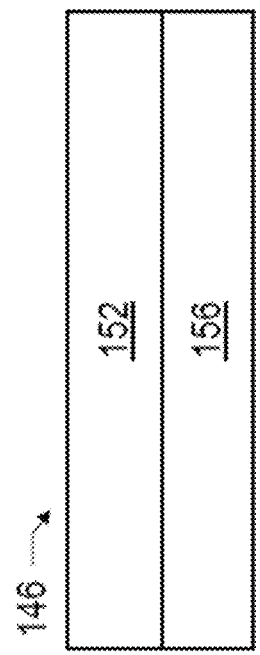
FIGS. 4-6 are cross-sectional views of various examples of quantum well stacks that may be used in a quantum dot device, according to some embodiments of the present disclosure.
Figure 5:
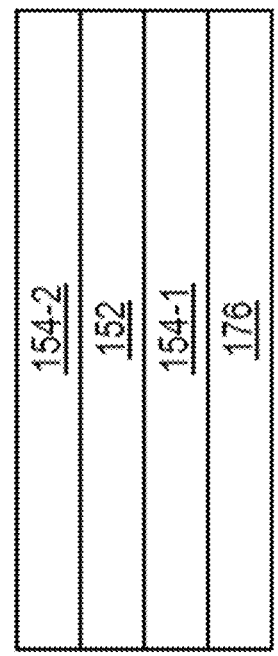
Figure 6:
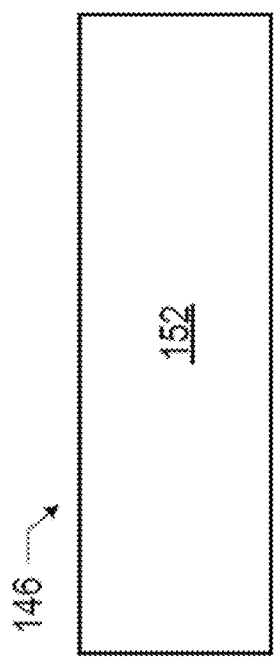

As discussed above, the base 102 and the fin 104 of a quantum dot device 100 may be formed from a semiconductor substrate 144 and a quantum well stack 146 disposed on the semiconductor substrate 144. The quantum well stack 146 may include a quantum well layer in which a 2DEG may form during operation of the quantum dot device 100. The quantum well stack 146 may take any of a number of forms, several of which are illustrated in FIGS. 4-6. The various layers in the quantum well stacks 146 discussed below may be grown on the semiconductor substrate 144 (e.g., using epitaxial processes).

FIG. 4 is a cross-sectional view of a quantum well stack 146 including only a quantum well layer 152. The quantum well layer 152 may be disposed on the semiconductor substrate 144, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 4 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. In some such embodiments, the intrinsic silicon may be strained, while in other embodiments, the intrinsic silicon may not be strained. The thicknesses (i.e., z-heights) of the layers in the quantum well stack 146 of FIG. 4 may take any suitable values. For example, in some embodiments, the thickness of the quantum well layer 152 (e.g., intrinsic silicon) may be between 0.8 and 1.2 microns.

FIG. 5 is a cross-sectional view of a quantum well stack 146 including a quantum well layer 152 and a barrier layer 154. The quantum well stack 146 may be disposed on a semiconductor substrate 144 such that the barrier layer 154 is disposed between the quantum well layer 152 and the semiconductor substrate 144. The barrier layer 154 may provide a potential barrier between the quantum well layer 152 and the semiconductor substrate 144. As discussed above with reference to FIG. 4, the quantum well layer 152 of FIG. 5 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 5 may be formed of silicon, and the barrier layer 154 may be formed of silicon germanium. The germanium content of this silicon germanium may be 20-80% (e.g., 30%). The thicknesses (i.e., z-heights) of the layers in the quantum well stack 146 of FIG. 5 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon) may be between 5 and 30 nanometers.

FIG. 6 is a cross-sectional view of a quantum well stack 146 including a quantum well layer 152 and a barrier layer 154-1, as well as a buffer layer 176 and an additional barrier layer 154-2. The quantum well stack 146 may be disposed on the semiconductor substrate 144 such that the buffer layer 176 is disposed between the barrier layer 154-1 and the semiconductor substrate 144. The buffer layer 176 may be formed of the same material as the barrier layer 154, and may be present to trap defects that form in this material as it is grown on the semiconductor substrate 144. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The thicknesses (i.e., z-heights) of the layers in the quantum well stack 146 of FIG. 6 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 154-1 (e.g., silicon germanium) may be between 0 and 400 nanometers. In some embodiments, the thickness of the quantum well layer 152 (e.g., silicon) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 6 may be formed of silicon, and the barrier layer 154-1 and the buffer layer 176 may be formed of silicon germanium. In some such embodiments, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1, but may be thicker than the barrier layer 154-1 so as to absorb the defects that may arise during growth. The barrier layer 154-2, like the barrier layer 154-1, may provide a potential energy barrier around the quantum well layer 152, and may take the form of any of the embodiments of the barrier layer 154-1. In some embodiments of the quantum well stack 146 of FIG. 6, the buffer layer 176 and/or the barrier layer 154-2 may be omitted.

The semiconductor substrate 144 and the quantum well stack 146 may be distributed between the base 102 and the fins 104 of the quantum dot device 100, as discussed above. This distribution may occur in any of a number of ways. For example, FIGS. 7-13 illustrate example base/fin arrangements 158 that may be used in a quantum dot device 100, in accordance with various embodiments.

Figure 7:
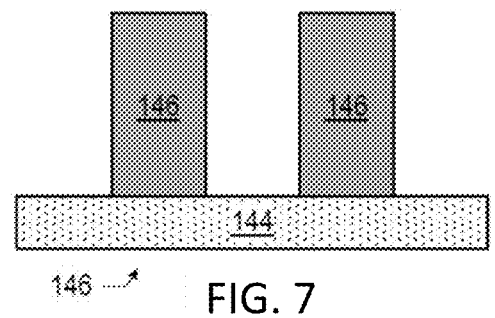
FIGS. 7-13 illustrate example base/fin arrangements that may be used in a quantum dot device, according to some embodiments of the present disclosure.

In the base/fin arrangement 158 of FIG. 7, the quantum well stack 146 may be included in the fins 104, but not in the base 102. The semiconductor substrate 144 may be included in the base 102, but not in the fins 104. Manufacturing of the base/fin arrangement 158 of FIG. 7 may include fin etching through the quantum well stack 146, stopping when the semiconductor substrate 144 is reached.

Figure 8:
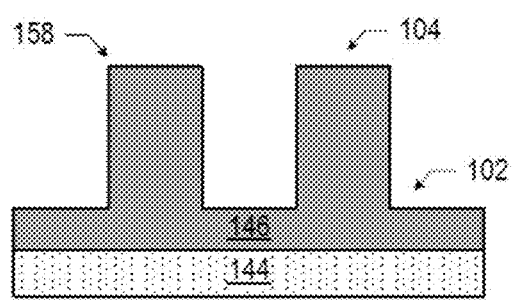
Figure 9:
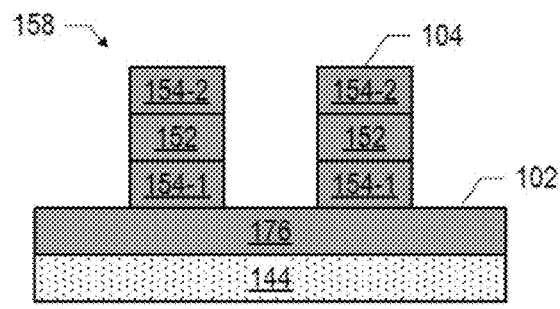

In the base/fin arrangement 158 of FIG. 8, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 8 may include fin etching that etches partially through the quantum well stack 146, and stops before the semiconductor substrate 144 is reached. FIG. 9 illustrates a particular embodiment of the base/fin arrangement 158 of FIG. 8. In the embodiment of FIG. 9, the quantum well stack 146 of FIG. 6 is used; the fins 104 include the barrier layer 154-1, the quantum well layer 152, and the barrier layer 154-2, while the base 102 includes the buffer layer 176 and the semiconductor substrate 144.

Figure 10:
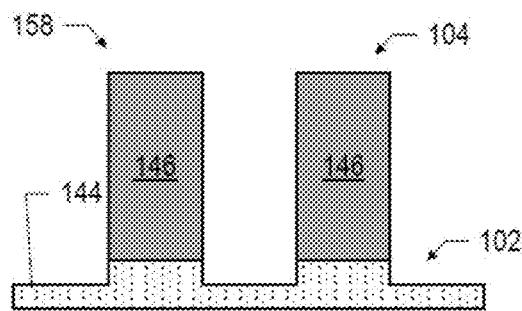
Figure 11:
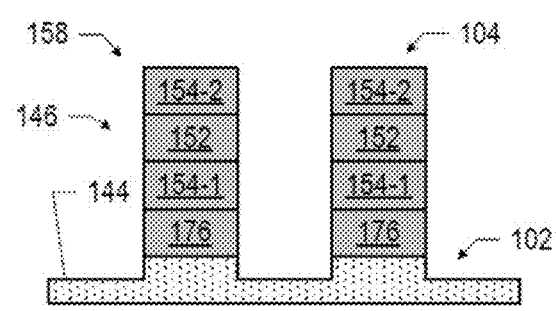

In the base/fin arrangement 158 of FIG. 10, the quantum well stack 146 may be included in the fins 104, but not the base 102. The semiconductor substrate 144 may be partially included in the fins 104, as well as in the base 102. Manufacturing the base/fin arrangement 158 of FIG. 10 may include fin etching that etches through the quantum well stack 146 and into the semiconductor substrate 144 before stopping. FIG. 11 illustrates a particular embodiment of the base/fin arrangement 158 of FIG. 10. In the embodiment of FIG. 11, the quantum well stack 146 of FIG. 6 is used; the fins 104 include the quantum well stack 146 and a portion of the semiconductor substrate 144, while the base 102 includes the remainder of the semiconductor substrate 144.

Figure 12:
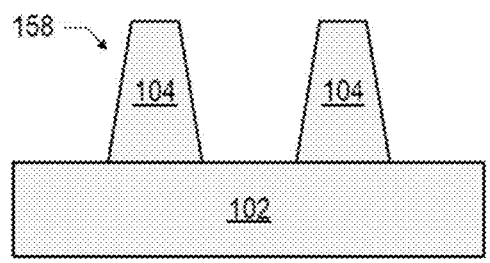

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 12, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 12. FIG. 13 illustrates a particular embodiment of the base/fin arrangement 158 of FIG. 12. In FIG. 13, the quantum well stack 146 is included in the tapered fins 104 while a portion of the semiconductor substrate 144 is included in the tapered fins and a portion of the semiconductor substrate 144 provides the base 102.

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

Example Quantum Circuit Components with Superconducting Qubits

Superconducting qubits are also promising candidates for building a quantum computer. Therefore, these are the types of qubit devices that may be used in a second example of a qubit device that may be used in a quantum circuit component to be integrated in a package with one or more filter modules such that both the quantum circuit component and the one or more filter modules are at least partially inside a chamber formed by a radiation shield structure, according to some embodiments of the present disclosure.

As shown in FIG. 14, an example superconducting quantum circuit 200 may include two or more qubits 202 (reference numerals following after a dash, such as e.g. qubit 202-1 and 202-2 indicate different instances of the same or analogous element). Superconducting qubits may operate based on the Josephson effect, which refers to a macroscopic quantum phenomenon of supercurrent, i.e. a current that, due to zero electrical resistance, flows indefinitely long without any voltage applied, across a non-linear inductive element such as a Josephson Junction. Josephson Junctions are integral building blocks in superconducting quantum circuits where they form the basis of quantum circuit elements that can approximate functionality of theoretically designed qubits. Therefore FIG. 14 illustrates that each of the superconducting qubits 202 may include one or more Josephson Junctions 204.

In general, a Josephson Junction includes two superconductors coupled by a so-called weak link that weakens the superconductivity between the two superconductors. In some embodiments, weak links of Josephson Junctions may be implemented by providing a thin layer of an insulating material, a conductive but not superconductive material, or a semiconducting material, typically referred to as a "barrier" or a "tunnel barrier," sandwiched, in a stack-like arrangement, between two layers of superconductor, which two superconductors typically referred to, respectively, as a "first electrode" and a "second electrode" of a Josephson Junction. Josephson Junction provides a non-linear inductive element to the circuit and allows the qubit to become an anharmonic oscillator. The anharmonicity is what allows the state of the qubit to be controlled to a high level of fidelity.

Typically, when a qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit, which, in turn, allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing DC or a pulse of current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Turning back to FIG. 14, within each qubit 202, the one or more Josephson Junctions 204 may be directly electrically connected to one or more other circuit elements 206, which, in combination with the Josephson Junction(s) 204, form a non-linear oscillator circuit providing multi-level quantum system where the first two to three levels define the qubit under normal operation. The circuit elements 206 could be e.g. shunt capacitors, superconducting loops of a SQUID, electrodes for setting an overall capacitance of a qubit, or/and ports for capacitively coupling the qubit to one or more of a readout resonator, a coupling or "bus" component, and a direct microwave drive line, or electromagnetically coupling the qubit to a flux bias line.

As also shown in FIG. 14, an example superconducting quantum circuit 200 may include means 208 for providing external control of qubits 202 and means 210 for providing internal control of qubits 202. In this context, "external control" refers to controlling the qubits 202 from outside of, e.g. an IC chip comprising the qubits, including control by a user of a quantum computer, while "internal control" refers to controlling the qubits 202 within the IC chip. For example, if qubits 202 are transmons, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 202, the external control means 208, and the external control means 210 of the quantum circuit 200 may be provided on, over, or at least partially embedded in a substrate (not shown in FIG. 14).

FIG. 15 provides a schematic illustration of an example physical layout of a superconducting quantum circuit 211 where qubits are implemented as transmons, according to some embodiments of the present disclosure.

Similar to FIG. 14, FIG. 15 illustrates two qubits 202. In addition, FIG. 15 illustrates flux bias lines 212, microwave lines 214, a coupling resonator 216, a readout resonator 218, and connections (e.g. wirebonding pads or any other suitable connections) 220 and 222. The flux bias lines 212 and the microwave lines 214 may be viewed as examples of the external control means 208 shown in FIG. 14. The coupling resonator 216 and the readout resonator 218 may be viewed as examples of the internal control means 210 shown in FIG. 14.

Running a current through the flux bias lines 212, provided from the connections 220, allows tuning (i.e. changing) the frequency of the corresponding qubits 202 to which each line 212 is connected. In general, it operates in the following manner. As a result of running the current in a particular flux bias line 212, magnetic field is created around the line. If such a magnetic field is in sufficient proximity to the qubit 202, e.g. by a portion of the flux bias line 212 being provided next to the qubit 202, the magnetic field couples to the qubit, thereby changing the spacing between the energy levels of the qubit. This, in turn, changes the frequency of the qubit since the frequency is directly related to the spacing between the energy levels via Planck's equation. The Planck's equation is $E=hv$, where E is the energy (in this case the energy difference between energy levels of a qubit), h is the Planck's constant and v is the frequency (in this case the frequency of the qubit). As this equation illustrates, if E changes, then v changes. Provided there is sufficient multiplexing, different currents can be sent down each of the flux lines allowing for independent tuning of the various qubits.

Typically, the qubit frequency may be controlled in order to bring the frequency either closer to or further away from another resonant item, for example a coupling resonator such as 216 shown in FIG. 15 that connects two or more qubits together, as may be desired in a particular setting.

For example, if it is desirable that a first qubit 202 (e.g. the qubit 202 shown on the left side of FIG. 15) and a second qubit 202 (e.g. the qubit 202 shown on the right side of FIG. 15) interact, via the coupling resonator 216 connecting these qubits, then both qubits 202 may need to be tuned to be at nearly the same frequency. One way in which such two qubits could interact is that, if the frequency of the first qubit 202 is tuned very close to the resonant frequency of the coupling resonator 216, the first qubit can, when in the excited state, relax back down to the ground state by emitting a photon (similar to how an excited atom would relax) that would resonate within the coupling resonator 216. If the second qubit 202 is also at this energy (i.e. if the frequency of the second qubit is also tuned very close to the resonant frequency of the coupling resonator 216), then it can absorb the photon emitted from the first qubit, via the coupling resonator 216, and be excited from its ground state to an excited state. Thus, the two qubits interact in that a state of one qubit is controlled by the state of another qubit. In other scenarios, two qubits could interact via a coupling resonator at specific frequencies, but these three elements do not have to be tuned to be at nearly the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator. If there is nowhere for such a frequency-detuned photon to go, the qubit will be better isolated from its surroundings and will live longer in its current state. Thus, in general, two or more qubits could be configured to avoid or eliminate interactions with one another by tuning their frequencies to specific values or ranges.

The state(s) of each qubit 202 may be read by way of its corresponding readout resonator 218. As explained below, the qubit 202 induces a resonant frequency in the readout resonator 218. This resonant frequency is then passed to the microwave lines 214 and communicated to the pads 222.

To that end, a readout resonator 218 may be provided for each qubit. The readout resonator 218 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 218 is coupled to the qubit by being in sufficient proximity to the qubit 202, more specifically in sufficient proximity to the capacitor of the qubit 202, when the qubit is implemented as a transmon, either through capacitive or inductive coupling. Due to a coupling between the readout resonator 218 and the qubit 202, changes in the state of the qubit 202 result in changes of the resonant frequency of the readout resonator 218. In turn, because the readout resonator 218 is in sufficient proximity to the microwave line 214, changes in the resonant frequency of the readout resonator 218 induce changes in the current in the microwave line 214, and that current can be read externally via the wire bonding pads 222.

The coupling resonator 216 allows coupling different qubits together, e.g. as described above, in order to realize quantum logic gates. The coupling resonator 216 is similar to the readout resonator 218 in that it is a transmission line that includes capacitive connections to ground on both sides (i.e. a half wavelength resonator), which also results in oscillations within the coupling resonator 216. Each side of the coupling resonator 216 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 216 has coupling with a respective different qubit, the two qubits are coupled together through the coupling resonator 216. In this manner, state of one qubit depends on the state of the other qubit, and the other way around. Thus, coupling resonators may be employed in order to use a state of one qubit to control a state of another qubit.

In some implementations, the microwave line 214 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 214 shown in FIG. 15 may be used to only readout the state of the qubits as described above, while separate drive lines such as e.g. drive lines 224 shown in FIG. 15, may be used to control the state of the qubits. In such implementations, the microwave lines used for readout may be referred to as readout lines (e.g. readout line 214), while microwave lines used for controlling the state of the qubits may be referred to as drive lines (e.g. drive lines 224). The drive lines 224 may control the state of their respective qubits 202 by providing, using e.g. connections 226 as shown in FIG. 15, a microwave pulse at the qubit frequency, which in turn stimulates (i.e. triggers) a transition between the states of the qubit. By varying the length of this pulse, a partial transition can be stimulated, giving a superposition of the states of the qubit.

Coupling resonators and readout resonators of the superconducting quantum circuit 200 or 211 may be configured for capacitive coupling to other circuit elements at one or both ends in order to have resonant oscillations, whereas flux bias lines and microwave lines are intended to be non-resonant microwave transmission lines. In general, a resonator of a quantum circuit differs from a non-resonant microwave transmission line in that a resonator is a transmission line that is deliberately designed to support resonant oscillations (i.e. resonance) within the line, under certain conditions. In contrast, non-resonant transmission lines may be similar to conventional microwave transmission lines in that they are designed to avoid resonances, especially resonances at frequencies/wavelengths close to the resonant frequencies/wavelengths of any resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible. For example, the ends of non-resonant transmission lines are typically engineered to have a specific impedance (e.g. substantially 50 Ohm) to minimize impedance mismatches to other circuit elements to which the lines are connected, in order to minimize the amount of reflected signal at transitions (e.g., transitions from the chip to the package, the package to the connector, etc.).

Each one of the resonators and non-resonant transmission lines of a superconducting quantum circuit may be implemented as any suitable architecture of a microwave transmission line, such as e.g. a coplanar waveguide, a stripline, a microstrip line, or an inverted microstrip line. Typical materials to make the lines and resonators include Al, Nb, NbN, TiN, MoRe, and NbTiN, all of which are particular types of superconductors. However, in various embodiments, other suitable superconductors and alloys of superconductors may be used as well.

In various embodiments, various lines and qubits shown in FIG. 15 could have shapes and layouts different from those shown in that FIG. For example, some lines or resonators may comprise more curves and turns while other lines or resonators may comprise less curves and turns, and some lines or resonators may comprise substantially straight lines. In some embodiments, various lines or resonators may intersect one another, in such a manner that they don't make an electrical connection, which can be done by using e.g. a bridge, bridging one interconnect over the other. As long as these lines and resonators operate in accordance with use of such lines and resonators as known in the art for which some example principles were described above, quantum circuits with different shapes and layouts of the lines, resonators and qubits than those illustrated in FIG. 15 are all within the scope of the present disclosure.

While FIGS. 14 and 15 illustrate examples of quantum circuits comprising only two qubits 202, embodiments with any larger number of qubits are possible and are within the scope of the present disclosure. Furthermore, while FIGS. 14 and 15 illustrate embodiments specific to transmons, subject matter disclosed herein is not limited in this regard and may include other embodiments of quantum circuits implementing other types of superconducting qubits that would also utilize Josephson Junctions as described herein, all of which are within the scope of the present disclosure.

A quantum circuit component to be integrated in a package with one or more filter modules, as described herein, may include one or more of the superconducting qubit devices 202.

Integrating Stackable In-Line Filter Modules with a Quantum Circuit Component

Figure 16:
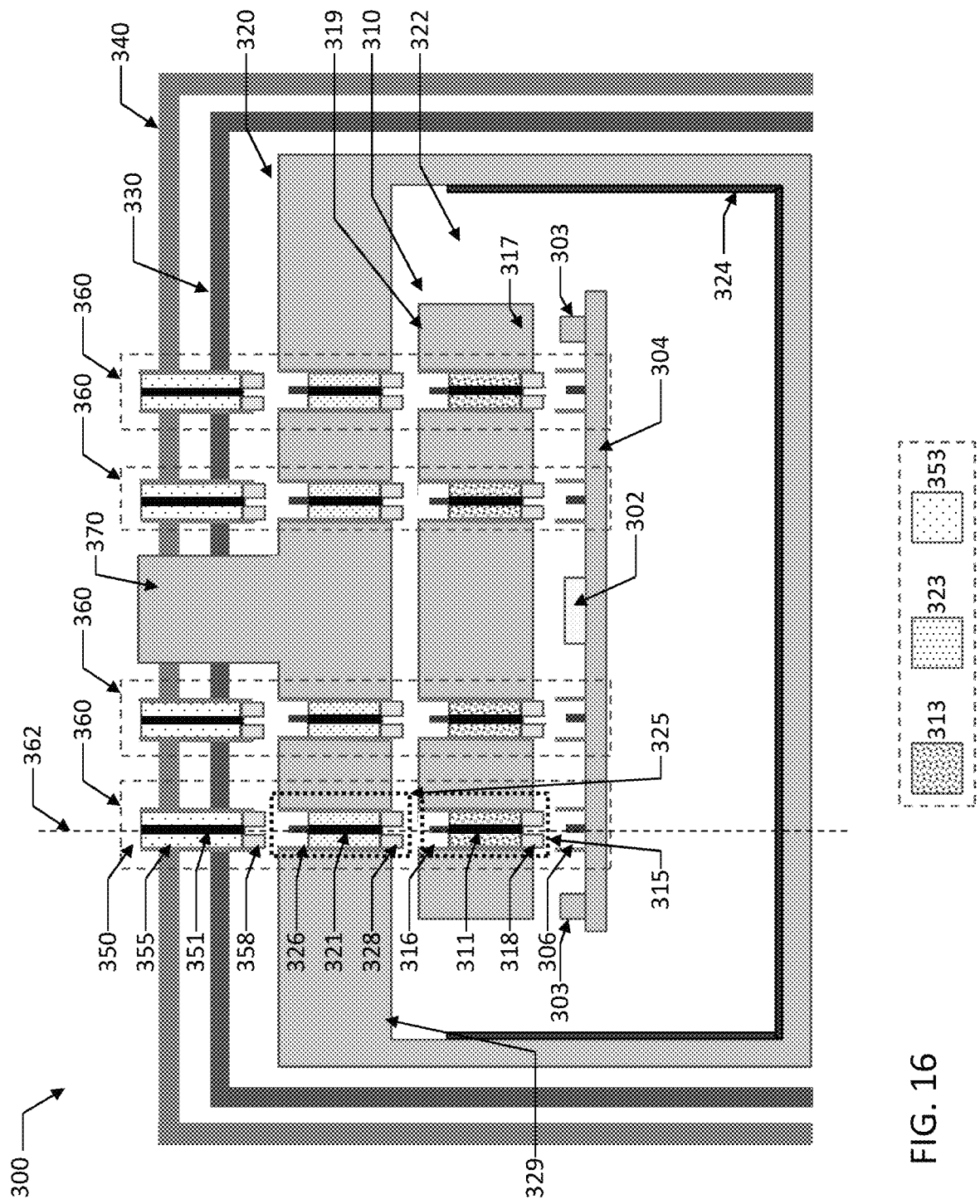
FIG. 16 provides a schematic illustrations of a quantum circuit assembly with a quantum circuit component and an in-line filter module, according to some embodiments of the present disclosure.

FIG. 16 provides a schematic illustrations of a quantum circuit assembly 300 with a quantum circuit component 302 and an in-line filter module 310, according to one or more embodiments of the present disclosure. FIG. 16 further illustrates a radiation shield structure 320. In particular, FIG. 16 illustrates that the radiation shield structure 320 may form a chamber 322 which may surround the quantum circuit component 302 at least partially, or completely, as shown in the example embodiment of FIG. 16, in order to effectively attenuate electromagnetic radiation incident on the quantum circuit component 302.

The quantum circuit component 302 may include a die with any combination of one or more qubit devices, e.g. any one or more of the quantum dot qubits or superconducting qubits as described above. In general, the term "die" refers to a small block of semiconductor material/substrate on which a particular functional circuit is fabricated. On the other hand, an IC chip, also referred to as simply a chip or a microchip, sometimes refers to a semiconductor wafer on which thousands or millions of such devices or dies are fabricated. However, other times, an IC chip refers to a portion of a semiconductor wafer (e.g. after the wafer has been diced) containing one or more dies, or the terms "chip" and "die" are used interchangeably. The quantum circuit component 302 may be any component that includes one or more, typically a plurality, of qubits which may be used to perform quantum processing operations. For example, the quantum circuit component 302 may include one or more quantum dot devices 100 or one or more devices 200 or 211 implementing superconducting qubits. However, in general, the quantum circuit component 302 may include any type of qubits, all of which are within the scope of the present disclosure.

FIG. 16 illustrates the quantum circuit component 302 being provided on a support structure 304. In various embodiments, the support structure 304 may be any suitable support structure over which at least the quantum circuit component 302 and one or more connectors 306 may be provided, such as a semiconductor substrate, a package substrate, a printed circuit board (PCB), etc. In some embodiments, the support structure 304 may be a structure over which the quantum circuit component 302 may be secured within the chamber 322 at a location where the quantum circuit component 302 is at least partially surrounded by the radiation shield structure 320. For example, in such embodiments, the support structure 304 may be seen as, or may include, mechanical attachment means for securing the quantum circuit component 302 at a desired location with respect to the radiation shield structure 320. Although only a single quantum circuit component 302 is shown in FIG. 16, a plurality of such quantum circuit components may be included in the quantum circuit assembly 300, e.g., provided at different locations with respect to the support structure 304.

In some embodiments, the quantum circuit component 302 may be included in the quantum circuit assembly 300 as a part of a quantum processing device, e.g., a part of a quantum processing device 2026 described with reference to FIG. 21. In other words, in some embodiments, the quantum circuit component 302 included in the quantum circuit assembly 300 may be a quantum processing device that may include one or more further components besides qubit devices, e.g., any one or more of the components of the quantum processing device 2026 described with reference to FIG. 21.

In some embodiments, the quantum circuit component 302 may be included in the quantum circuit assembly 300 as a part of a device assembly, e.g., a part of a device assembly 1200 described with reference to FIG. 20. In other words, in some embodiments, the quantum circuit component 302 included in the quantum circuit assembly 300 may be a device assembly that may include one or more further components besides qubit devices, e.g., any one or more of the components of the device assembly 1200 described with reference to FIG. 20.

Turning to the radiation shield structure 320, FIG. 16 illustrates that the quantum circuit component 302 may be included within the chamber 322 of the radiation shield structure 320. At least a portion of the inner surface of the chamber 322, e.g., at least a portion of a surface of the radiation shield structure 320 that faces the quantum circuit component 302 may be covered with a material 324 configured to absorb radiation, e.g. infrared (IR) radiation (the material 324 may, therefore, be referred to as a "radiation absorbing material"). In various embodiments, the radiation absorbing material 324 may include any suitable radiation absorbing coating, and may include one or more of a material containing silicon and carbon (e.g., silicon-carbide, e.g., silicon carbide grains), possibly with stycast, or Aeroglaze. In some embodiments, the radiation absorbing material 324 provided over the inner walls of the chamber 322 may have a thickness between about 100 nanometers and 5 millimeters, including all values and ranges therein, e.g., between about 2 micrometers and 2 millimeters or between about 500 micrometers and 1 millimeters.

In some embodiments, the in-line filter module 310 may also be included in the chamber 322, as shown in FIG. 16, in which case the radiation shield structure 320 may also attenuate electromagnetic radiation incident on the in-line filter module 310. In particular, in some embodiments, at least a portion of a surface of the radiation shield structure 320 that faces the in-line filter module 310 may be covered with the radiation absorbing material 324.

Figure 18:
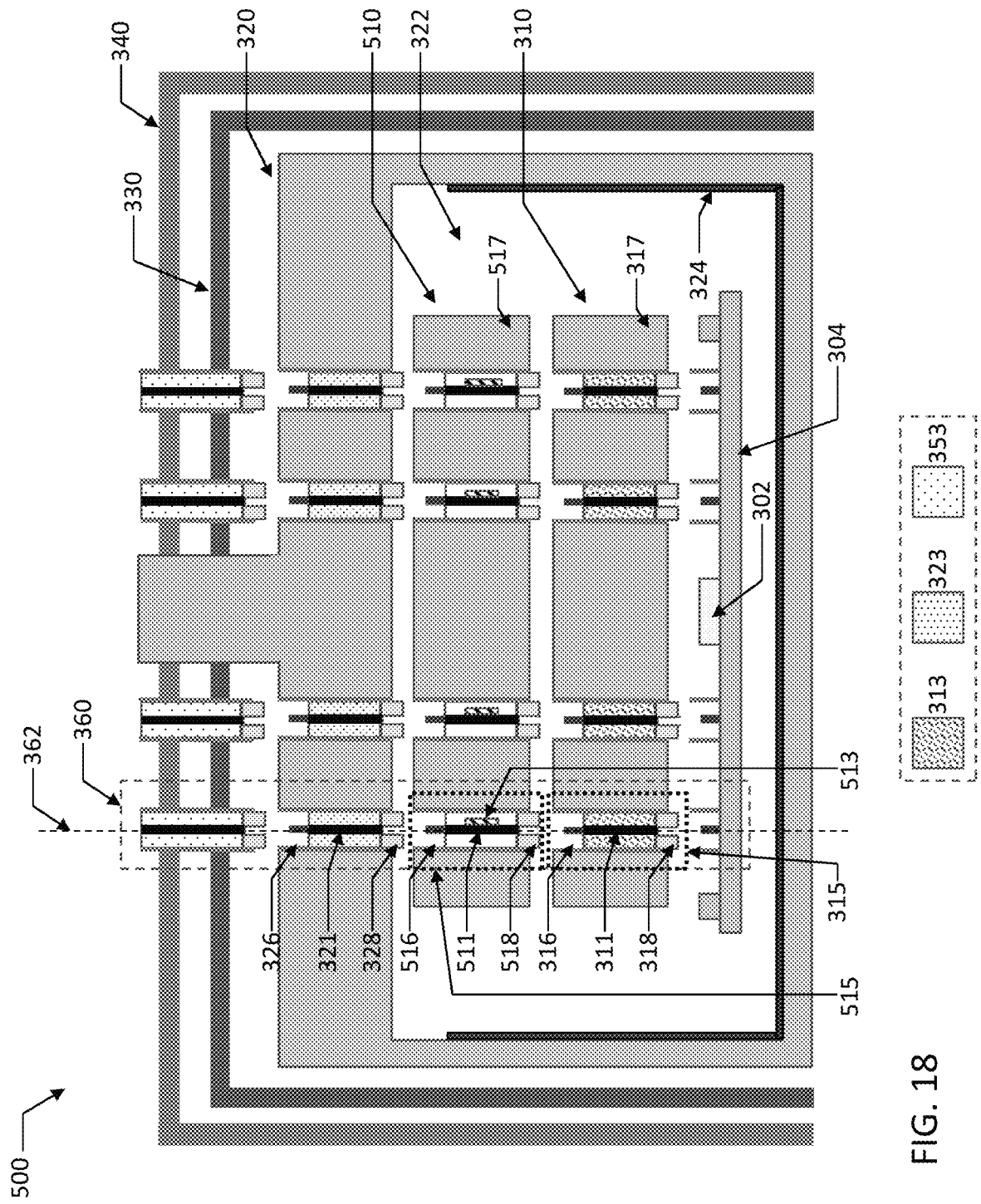
FIG. 18 provides a schematic illustration of a quantum circuit assembly with a quantum circuit component and stackable in-line filter modules, according to some embodiments of the present disclosure.

Although only a single in-line filter module 310 is shown in FIG. 16, a plurality of such in-line filter modules may be included in the quantum circuit assembly 300, e.g., provided within the chamber 322, e.g., stacked over one another over the plane of the quantum circuit component 302, as shown in FIG. 18 and described in greater detail below.

In some embodiments, the radiation shield structure 320 may be at least partially surrounded by a shield 330, e.g., as shown in FIG. 16, configured to reduce or eliminate external electromagnetic fields from affecting the shielded environment of the chamber 322. In some embodiments, the shield 330 may, e.g., be a structure of a suitable superconductive material such as aluminum.

In some embodiments, the radiation shield structure 320 may be at least partially surrounded by a shield 340, e.g., as shown in FIG. 16, configured to reduce or eliminate external magnetic fields from affecting the shielded environment of the chamber 322. In some embodiments, the shield 340 may, e.g., be a structure of a suitable magnetic shield material such as a metal material having a relatively high magnetic permeability at cryogenic temperatures. One example of such a material is cryoperm. In some embodiments, multiple layers of the shield 340 may be used, enclosing one another and separated from one another by a certain distance.

In some embodiments, at least the radiation shield structure 320 with one or more in-line filter modules 310 may form a package so that the one or more filter modules 310 may be integral (i.e., included as a part of a whole, rather than supplied separately) to the package. In other embodiments, the shield 330 and/or the shield 340 may also be a part of the package. In some embodiments, such a package may be a hermetically sealed package. For example, in some embodiments, the chamber 322 may be substantially under vacuum, e.g., the pressure within the package may be less than about $1\times10^{-3}$ bar, including all values and ranges therein, e.g., less than about $1\times10^{-4}$ bar, or less than about $1\times10^{-5}$ bar.

Although not specifically shown in FIG. 16, such a package may further include mechanical attachment means for securing the package within a larger system, e.g., within a cryogenic chamber of a cooling apparatus (e.g., within a cryogenic refrigeration system such as a dilution refrigerator). A combination of the radiation shield structure 320 with such mechanical attachment means for securing the package within a larger system may be seen as a "radiation shield arrangement." Furthermore, such a package may further include mechanical attachment means for securing the quantum circuit component 302 at a location where the quantum circuit component 302 is at least partially surrounded by the radiation shield structure 320. Various mechanical attachment means of such a package may include any suitable structures/devices for the package within a larger system (e.g., within a cryogenic chamber of a cooling apparatus) and/or securing the quantum circuit component 302 at a location where the quantum circuit component 302 is at least partially surrounded by the radiation shield structure 320. Examples of mechanical attachment means that may be used within the quantum circuit assembly 300 may include quick disconnects, lag bolts, twist-lock mechanisms, bayonet fasteners, threaded inserts, magnetic interfaces, and self-centering attachment mechanisms with detents. Quick disconnects may include clamping mechanisms that induce clamping pressure on hermetic seals to create seal after physical mounting. Clamping pressure may also be applied on temperature stages for conductive heat transfer. Lag bolts may be arranged such they extend along the length of the insert and have threads on either the interior or exterior of the assembly. The bolts may be tightened, applying pressure on seals and temperature stages. Twist-lock mechanisms work by inserting the apparatus, then twisting, which will interface with seals and temperature stages to apply pressure and lock into place. Bayonet fasteners may work in a similar fashion, where pins follow an incline and/or cam profile, to apply pressure on seals and temperature stages, prior to locking into position. Threaded inserts may operate by having the entire assembly rotate into the cooling apparatus, until sufficient clamping force is applied. Then the inserted assembly is locked into place. Magnetic interfaces may operate with strong permanent magnets, which may hold the temperature stages and sealing surfaces together. After pumping down, the added pressure will ensure good thermal contact. Self-centering mechanisms and assemblies may be applied in combination with any fastening technique described above, and may allow for the assembly to easily guide into final resting position. In some embodiments, the mechanical attachment means of the quantum circuit assembly 300 may be configured to work together (e.g., fit) with corresponding mechanical attachment means of a cooling apparatus. In some embodiments, the mechanical attachment means of the quantum circuit assembly 300 may be such that they can work together with different types of cooling apparatus. In some embodiments, the mechanical attachment means of the quantum circuit assembly 300 may be integral to the quantum circuit assembly 300 (i.e., the quantum circuit assembly 300 and the attachment means of the quantum circuit assembly 300 are configured to be inserted into the cooling apparatus and taken out of the cooling apparatus as a single unit, as a whole). The form factor of the quantum circuit assembly 300 may be such that is may be suitable for placing into and taking out of a cooling apparatus, or, in some implementations, multiple cooling apparatus of different types.

During operation of the quantum circuit assembly 300, signals may be exchanged between the quantum circuit component 302 and external electronics, where electrical connectivity between the quantum circuit component 302 and the external electronics may be supported by one or more cables 350 connected to the corresponding feedthrough connectors 325 of the radiation shield structure 320 and further connected to the corresponding interconnects 315 of the one or more filter modules 310, as described herein. Such external electronics are not specifically shown in FIG. 16, and, as known in the art, may include microwave sources, arbitrary waveform generators, microwave vector sources, DC voltage and current sources, amplifiers of various kinds (quantum limited, radiofrequency, lower-than-radio-frequency, cryogenic and room temperature), digitization instruments, controllers (e.g., FPGA-based controllers) of the quantum hardware, and combinations of such devices.

In order to not clutter the drawing, only one cable 350 is labeled in FIG. 16 with a reference numeral although 3 additional cables 350 are shown. The cable 350 labeled with the reference numeral is shown in FIG. 16 to be included within a dashed contour 360. The dashed contour 360 is intended to illustrate intermediate components that may be used to support electrical connectivity and propagation of signals between the cable 350 and the quantum circuit component 302. A line 362 within the dashed contour 360 illustrates an imaginary line along which the center conductors carrying signals between the cable 350 and the quantum circuit component 302 may be communicated. Since FIG. 16 illustrates 4 cables 350, four of such dashed contours 360 are illustrated in FIG. 16, where, again, the components within the other 3 dashed contours 360 are not specifically labeled in order to not clutter the drawing because all dashed contours 360 may be implemented in the same manner. Of course, in other embodiments, any other number of cables 350 may be used to connect the quantum circuit component 302 to the external electronics using the component shown within the dashed contour 360.

Now, components within a single dashed contour 360 will be described.

As shown in FIG. 16, in some embodiments, the cable 350 may be implemented as a coaxial cable having a center conductor 351 and a shield conductor 355 which may surround the center conductor 351 and be separated from the center conductor 351 by a dielectric material 353, as known in the field of cables. The dielectric material 353 may, e.g., include fluoropolymers such as polytetrafluoroethylene (Teflon) or perfluoroalkoxy alkane (PFA) or variants thereof, polyimides such as Kapton or variants thereof, polyethylene, polypropylene, fluorinated ethylene propylene, as well as graphite-coated dielectrics. Although not specifically shown in FIG. 16, in some embodiments, the cable 350 may be a triaxial cable in which case an additional conductor 355 may surround the center conductor 351. The cable 350 may end with a connector 358 configured to couple the cable 350 to the corresponding interconnect structure of the radiation shield structure 320. Said corresponding interconnect structure of the radiation shield structure 320 may be implemented as a feedthrough connector 325 (outlined in FIG. 16 with a dotted contour).

As shown in FIG. 16, the feedthrough connector 325 of the radiation shield structure 320 may include a first connector 326 and a second connector 328. An opening may extend between the first connector 326 and the second connector 328, with a center conductor 321 extending between, and electrically coupled to, the first connector 326 and the second connector 328 of the feedthrough connector 325. In some embodiments, a dielectric material 323 may surround the center conductor 321 (e.g., the opening in the portion of the feedthrough connector 325 of the radiation shield structure 320 may, at least partially, be filled with the dielectric material 323). The dielectric material 323 may, e.g., include Teflon, or any other material configured to induce low loss of microwave signals and have small thermal expansion coefficients. Suitable materials include but are not limited to fluoropolymers such as polytetrafluoroethylene (Teflon) or perfluoroalkoxy alkane (PFA) or variants thereof, polyimides such as Kapton or variants thereof, polyethylene, polypropylene, fluorinated ethylene propylene, as well as graphite-coated dielectrics. The first connector 326 of the feedthrough connector 325 is configured to provide electrical coupling between a first end of the center conductor 321 of the opening in the radiation shield structure 320 and the cable 350 (i.e., a cable configured to enable propagation of electrical signals between one or more external electronic components and the quantum circuit component 302). In particular, the first connector 326 of the feedthrough connector 325 may be configured to connect to the connector 358 of the cable 350 so that the center conductor 351 of the cable 350 is electrically connected to the center conductor 321 of the feedthrough connector 325. It should be noted that, as shown in FIG. 16, in some embodiments, the connection between the cable 350 and the feedthrough connector 325 may be such that only the center conductor 351 continues further into the feedthrough connector 325 by being connected to the center conductor 321 of the feedthrough connector 325. The one or more shield conductors that may be included in the cable 350 (e.g., with one being connected to ground during operation of the assembly) do not continue into the radiation shield structure 320 and into the chamber 322. In other words, in some embodiments, at least one ground shield conductor of the cable 350 may abuts the first connector 326 of the radiation shield structure 320 and not continue into the opening of the radiation shield structure 320. This is in sharp contrast to conventional implementations where typically an entire RF cable (e.g., an entire cable 350) is connected to the quantum circuit component. The feedthrough connectors 325 may help ensure that the coaxial cables 350 do not act as antennas for noise from outside of the shielded environment of the chamber 322. For example, the feedthrough connectors 325 may enable achieving a sufficiently low photon temperature within the shielded environment of the chamber 322 by ensuring that the shield conductor(s) of the cables 350 do not enter the chamber 322 because the shield conductor(s) of the cables 350 may act as antennas for high-energy photons from the outside environment (high-energy photons, e.g. from hotter temperature plates of the cooling apparatus in which the quantum circuit assembly 300 is to be included, can disturb the performance of the qubits by e.g. populating resonators). The feedthrough connectors 325 may also minimize stray radiation entering the shielded environment compared to the clearance holes that would need to be provided in the radiation shield structure 320 in conventional implementations where the entire cables 350 are put through the holes to reach the chamber 322. In this manner, a low-temperature, low-noise environment may be ensured within this shield 320.

Continuing with FIG. 16, the second connector 328 of the feedthrough connector 325 may be configured to further couple the cable 350 to the corresponding interconnect structure of the in-line filter module 310. To that end, the second connector 328 of the feedthrough connector 325 may be configured to provide electrical coupling between a second end of the center conductor 321 of the opening in the radiation shield structure 320 and the quantum circuit component 302, via the corresponding interconnect structure of the filter module 310. Said corresponding interconnect structure of the filter module 310 may be implemented as an interconnect 315, e.g., another feedthrough connector (which, similar to the feedthrough connector 325, is also outlined in FIG. 16 with a corresponding dotted contour).

As shown in FIG. 16, similar to the feedthrough connector 325 of the radiation shield structure 320, the interconnect 315 of the filter module 310 may include a first connector 316 and a second connector 318 provided in or on a plate 317 of the filter module. An opening may extend through the plate 317, between the first connector 316 and the second connector 318, with a center conductor 311 extending between, and electrically coupled to, the first connector 316 and the second connector 318 of the interconnect 315. In some embodiments, a dielectric material 313 may surround the center conductor 311 (e.g., the opening in the portion of the interconnect 315 of the filter module 310 may, at least partially, be filled with the dielectric material 313). The dielectric material 313 may be used to implement a filter configured to convert RF energy to heat (i.e., the filter is configured to attenuate electromagnetic interference by converting RF energy to heat). To that end, in some embodiments, the dielectric material 313 may be a special eccosorb-based material (e.g., an epoxy-based material and/or other materials absorptive at RF frequencies, such as copper powder), surrounding at least a portion of the center conductor 311, for filtering radiation, e.g., IR light, from affecting the quantum circuit component 302. Incoming IR light can produce quasiparticles, which act as dissipative metallic conductors. Quasiparticles have the principle effect of decreasing coherence within the quantum circuit component 302 (i.e., reducing qubit coherence times). Thus, the interconnect 315 may be seen as an eccosorb filter, which may be behave as a low-pass filter, integrated with the center conductor 311. The eccosorb filter of the interconnect 315 may be a two-port device (one port being the first connector 316 and the other port being the second connector 318) with relatively low attenuation and reflections within the bandwidth of application. In some embodiments, attenuation of the electromagnetic radiation provided by the dielectric material 313 may be controlled by adjusting the amount of the dielectric material 313 in the signal path along the line 362. For example, attenuation of the electromagnetic radiation provided by the dielectric material 313 may be controlled by adjusting the length of the interconnect 315, hence adjusting the amount of eccosorb material 313 interacting with the incoming signal traversing the center conductor 311.

The first connector 316 of the interconnect 315 may be configured to provide electrical coupling between a first end of the center conductor 311 of the opening in the filter module 310 and the second connector 328 of the radiation shield structure 320. In particular, the first connector 316 of the interconnect 315 may be configured to connect to the second connector 328 of the radiation shield structure 320 so that the center conductor 321 of the of the radiation shield structure 320 is electrically connected to the center conductor 311 of the filter module 310. In turn, the second connector 318 of the interconnect 315 may be configured to further couple the cable 350 to the quantum circuit component 302. To that end, the second connector 318 of the interconnect 315 may be configured to provide electrical coupling between a second end of the center conductor 311 of the opening in the filter module 310 and the quantum circuit component 302, by virtue of being configured to connect to the connector 306 of the quantum circuit component 302. Similar to the description provided above for the radiation shield structure 320, it should be noted that, as shown in FIG. 16, in some embodiments, the connection between the cable 350 and the filter module 310 (via the feedthrough connector 325) may be such that only the center conductor 351 continues further into the feedthrough connector 325 by being connected to the center conductor 311 of the filter module 310.

In various embodiments, the types of signals supported by the cables 350, the feedthrough connectors 325 of the radiation shield structure 320, and the interconnects 315 of the one or more filter modules 310 may depend on what type of qubits are implemented in the quantum circuit component 302. Some examples of such signals will now be described with reference to a given interconnect assembly of a single dashed contour 360 of FIG. 16.

In one example, the quantum circuit component 302 may include at least one quantum dot qubit device (e.g., as described with reference to FIGS. 1-13) that includes at least one plunger gate. In such an example, the center conductors of one of the cables 350, the feedthrough connectors 325 of the radiation shield structure 320, and the interconnects 315 of the one or more filter modules 310 may be configured to support provision, from an external electronic component, of at least one plunger voltage to be applied to the plunger gate to control formation of one or more quantum dots in the qubit device.

In another example, the quantum circuit component 302 may include at least one quantum dot qubit device (e.g., as described with reference to FIGS. 1-13) that includes two or more plunger gates and a barrier gate. In such an example, the center conductors of one of the cables 350, the feedthrough connectors 325 of the radiation shield structure 320, and the interconnects 315 of the one or more filter modules 310 may be configured to support provision, from an external electronic component, of at least one barrier voltage to be applied to the barrier gate to control a potential barrier between two adjacent plunger gates of the two or more plunger gates.

In yet another example, the quantum circuit component 302 may include at least one quantum dot qubit device (e.g., as described with reference to FIGS. 1-13) that includes at least one plunger gate, at least one barrier gate, and at least one accumulation gate. In such an example, the center conductors of one of the cables 350, the feedthrough connectors 325 of the radiation shield structure 320, and the interconnects 315 of the one or more filter modules 310 may be configured to support provision, from an external electronic component, of at least one accumulation voltage to be applied to the at least one accumulation gate to control a number of charge carriers in an area between an area where one or more quantum dots are to be formed and a charge carrier reservoir.

In a next example, the quantum circuit component 302 may include at least one superconducting qubit device (e.g., as described with reference to FIGS. 14-15) that includes at least one flux bias line. In such an example, the center conductors of one of the cables 350, the feedthrough connectors 325 of the radiation shield structure 320, and the interconnects 315 of the one or more filter modules 310 may be configured to support provision of a current from an external electronic component to the flux bias line.

In another example, the quantum circuit component 302 may include at least one superconducting qubit device (e.g., as described with reference to FIGS. 14-15) that includes at least one microwave drive line. In such an example, the center conductors of one of the cables 350, the feedthrough connectors 325 of the radiation shield structure 320, and the interconnects 315 of the one or more filter modules 310 may be configured to support provision of a current from an external electronic component to the microwave drive line.

Figure 17:
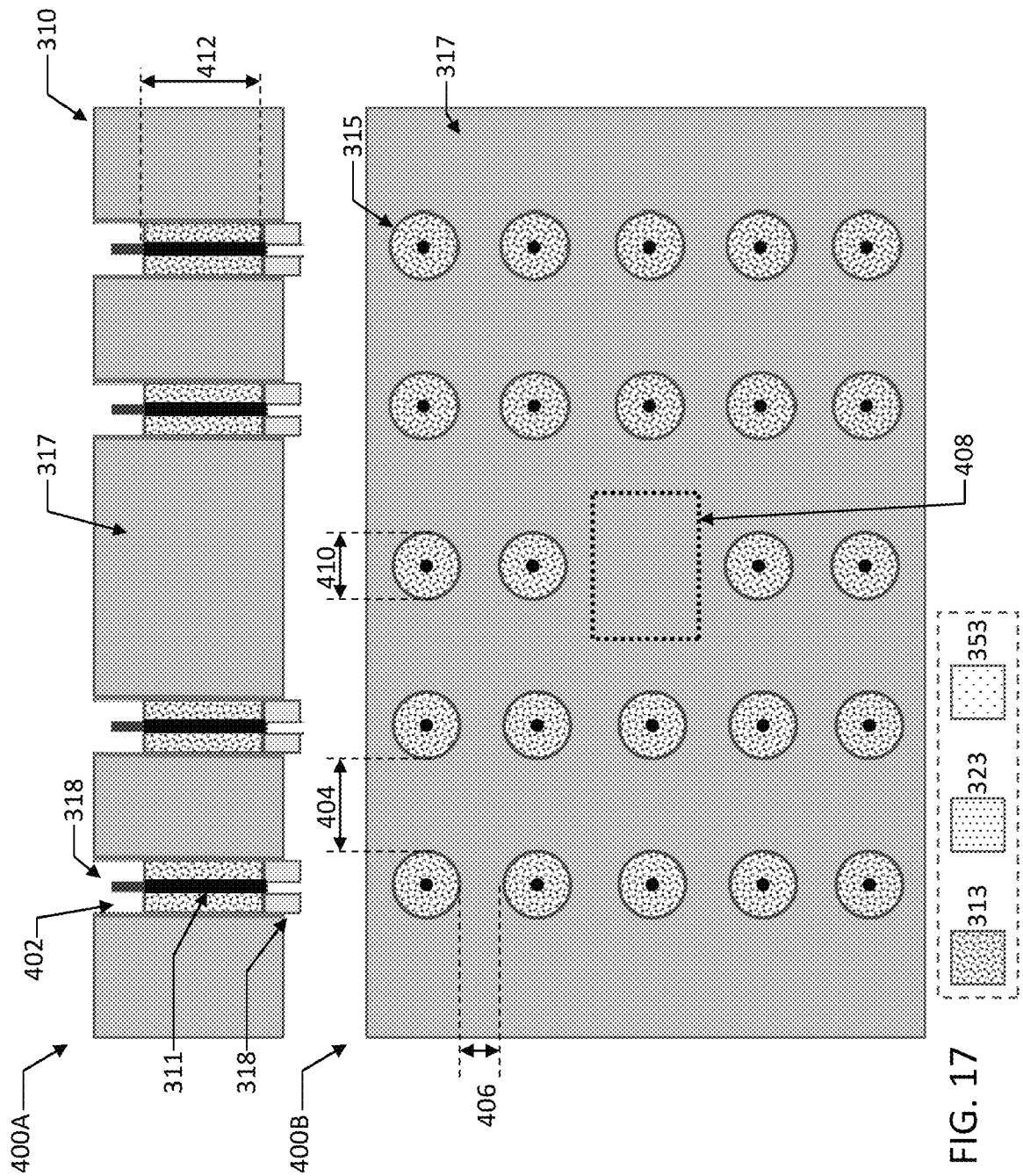
FIG. 17 provides a schematic illustration of details of an example in-line filter module, according to some embodiments of the present disclosure.

FIG. 17 provides additional details with respect to the filter module 310 according to some embodiments of the present disclosure. In particular, FIG. 17 provides an illustration 400A that is an enlarged version of the cross-sectional view of the filter module 310, similar to that shown in FIG. 16, but also further provides an illustration 400B that is a top-down view of the filter module 310, corresponding to the cross-sectional view of the illustration 400A. Reference numerals used in FIG. 17 which are the same reference numerals as those used in FIG. 16 are intended to illustrate the same or analogous elements so that, in the interests of brevity, their descriptions provided with respect to one figure are not repeated for the other. Again, the first connector 316 the filter module 310 is configured to provide electrical coupling between a first end of the center conductor 311 of an opening 402 in the plate 317 and a corresponding one of the cables 350, configured to enable propagation of electrical signals between an external electronic component and the quantum circuit component 302 of the quantum circuit assembly 300. The second connector 318 the filter module 310 is configured to provide electrical coupling between a second end of the center conductor 311 of the opening 402 (the second end being different from the first end) and the quantum circuit component 302. The first and second connectors 316, 318 and the opening 402 with the center conductor 311 and the filter material 313 may be seen as a filter assembly integrated into the plate 317, the filter assembly being configured to electrically couple to a given cable 350 (e.g., a coaxial cable or a triaxial cable) in order to support propagation of DC or RF signals between the cable 350 (leading up to the external component) and the quantum circuit component 302. In further embodiments, the plate 317 may include multiple instances of such filter assemblies, configured to electrically couple to different cables, as is shown in FIG. 17 with 4 example filter assemblies shown in the cross-sectional view 400A and with 24 example filter assemblies shown in the top-down view 400B (of course, in other embodiments, the different filter assemblies of the different interconnects 315 may be provided in the plate 317 in different numbers or at different locations within the plate 317).

In some embodiments, the distance between different interconnects 315 integrated in the filter module 310 (i.e., integrated in the plate 317), e.g., a distance 404 or a distance 406, shown in the top-down view 400B of FIG. 17, may be sufficiently large to reduce or eliminate cross-talk between the center lines 311 of different interconnects 315. For example, such a distance may be at least about 0.5 millimeter, including all values and ranges therein, e.g., at least about 1-2 millimeters, e.g., between about 1-2 and 15 millimeters. The top-down view 400B of FIG. 17 further illustrates an area 408 where an interconnect 315 seems to be missing. The area 408 illustrates 1) that the interconnects 315 do not necessarily need to be arranged in a perfect array (i.e., some of them may be missing or arranged differently), and/or 2) the area 408 may be where the quantum circuit component 302 is located under the filter module 310, and/or an area for making thermal contact between the plate 317 and the radiation shield structure 320.

In some embodiments, a cross-section of the openings for providing the interconnects 315 may be substantially circular, as shown in the top-down view 400B of FIG. 17. In some such embodiments, the diameter of the cross-section of the opening (e.g., distance 410 shown in FIG. 17) may be between about 0.05 and 10 millimeters, including all values and ranges therein, e.g., between about 0.1 and 7 millimeters, or between about 3 and 5 millimeters. The diameter of the interconnects 315 may be selected for impedance matching (e.g., to realize desired impedance of the interconnect 315). In some embodiments, a length of the center conductor 311 (e.g., distance 412 shown in FIG. 17) may be between about 0.5 and 50 millimeters, including all values and ranges therein, e.g., between about 1 and 20 millimeters, or between about 3 and 10 millimeters. The length of the center conductor 311 and, therefore, of the interconnect 315 may be selected to achieve desired filtering of RF signals using the material 313 that may fill the opening of the interconnect 315.

Although not specifically shown in the present figures, in some embodiments, not all of the interconnects 315 of the filter module 310 may be filled with the eccosorb-based material 313. As described above, the eccosorb-based material 313 may behave, effectively, as a low-pass filter, similar to a lossy coaxial cable connection. This may be advantageous for some, but not all, signal connections between the cables 350 and the quantum circuit component 302. For example, in the readout lines of superconducting qubits it may not necessarily be desirable to have the signal loss provided by the use of the eccosorb-based material 313. Therefore, the interconnects 315 connected to the cables 350 which serve as readout lines, may include a different material in place of the eccosorb-based material 313, e.g. Teflon, or any other low-loss dielectric material. Again, varying the diameter of such interconnects may allow achieving the desired impedance. In particular, diameter of the eccosorb-based material 313 would be different from the diameter of the interconnects 315 filled with a low-loss dielectric in order to have their impedances substantially equal despite different permittivity values of such materials.

It should be noted that FIG. 16 provides an illustration where various connectors are not yet connected to one another, as can be seen by observing that there is some space between corresponding connectors which supposed to be connected during operation of the assembly. For example, FIG. 16 illustrates an empty space between the connector 358 and the connector 326, another empty space between the connector 328 and the connector 316, and yet another empty space between the connector 318 and the connector 306. In operation of the assembly 300, these connectors would be connected (i.e., center conductors of the respective different cables/interconnects would be electrically connected to one another) and fit with one another so that the support structure 304, one or more filter modules 310, and the radiation shield structure 320 are stackable. To that end, in some embodiments, each pair of such connectors may include one male connector and one female connector, as shown in FIG. 16, where the connectors 318, 328, and 358 are shown as female connectors and the connectors 306, 316, and 326 are shown as male connectors. Thus, in some embodiments, the first connectors described herein could be male connectors and the second connectors described herein could be female connectors, or the other way around. In other embodiments, any of the first and second connectors described herein can be either one of the male and female connectors, in accordance with the design selected for the quantum circuit assembly 300. In some embodiments, the first and second connectors may be sub-miniature push-on connectors (SMP) connectors, or any RF/DC connectors, e.g., high-density connectors. In general, in various embodiments, the first and second connectors may me coaxial or triaxial connectors. The first and second connectors may include a relatively low-loss dielectric such as materials that include but are not restricted to fluoropolymers such as polytetrafluoroethylene (Teflon) or perfluoroalkoxy alkane (PFA) or variants thereof, polyimides such as Kapton or variants thereof, polyethylene, polypropylene, fluorinated ethylene propylene, as well as graphite-coated dielectrics. Furthermore, in some embodiments, the first and second connectors may be self-centering such that small mechanical misalignments are self-correcting and do not hamper the performance of the connection, and may be characterized by a low mating force of less than 8 kg, or less than 1 kg of less than 100 g per connector. In some embodiments, the fixing in place could be done with screws mounted on the sides of the filter block instead of clamping connectors (such as SMP are).

In order to minimize decoherence of the qubits of the quantum circuit component 302, thermal properties of some elements of the assembly 300 may be carefully selected so that a sufficiently low photon temperature may be achieved within the shielded environment of the chamber 322. Considerations with respect to such thermal properties will now be described.

For example, in some embodiments, the quantum circuit component 302 may be mounted on a well-thermalized surface of the support structure 304. As used herein, a surface or a certain block of material (e.g., the support structure 304 or the plate 317) may be considered to be "well-thermalized" when the thermal conduction between the parts is good enough to allow the temperature difference between the parts even when an active thermal load is applied to at least one of the parts to be as small as possible, for example less than a factor of 10, or less than a factor of 2, or less than a factor of 1.01.

In some embodiments, the materials of the radiation shield structure 320 and of the plate 317 of the filter module 310 may be selected as materials that are good thermal conductors at the typical operating temperatures of the quantum circuit assembly 300 (e.g., at milliKelvin temperatures) in order to absorb heat around the quantum circuit component 302, which should help to increase coherence times of qubits. To that end, in some embodiments, the connector 328 and the connector 316 may be such that, when they are connected, at least a portion of the radiation shield structure 320 is in thermal contact with at least a portion of the filter module 310, which may be used to achieve a better thermal conductivity, leading to effectively lower temperatures in the quantum circuit assembly 300. For example, in some such embodiments, at least a portion of a surface 329 of the radiation shield structure 320 may be in thermal contact with at least a portion of a surface 319 of the plate 317 of the filter module 310. In some such embodiments, a surface area of the plate 317 that is in thermal contact with a portion of the surface 329 of the radiation shield 320 may be at least about 300 or 400 square millimeters, e.g., at least about 1000 square millimeters, or at least about 1200 square millimeters, including all values and ranges therein. The radiation shield structure 320 may include a portion 370 extending away from the quantum circuit component 302, towards a thermalization or refrigeration plate configured to ensure a maximally good thermalization of the radiation shield structure 320 and the quantum circuit component therein, ideally to the temperature of the refrigeration plate or only a factor of 10 or a factor of 2 or a factor of 1.1 higher.

Some considerations for the materials of the radiation shield structure 320 and of the plate 317 of the filter module 310 will now be described. These considerations may be particularly relevant for the portions of the surfaces of the radiation shield structure 320 and the plate 317 of the filter module 310 which are in thermal contact during operation of the quantum circuit assembly 300.

A high-purity copper is one example material that is a good thermal conductor. On the other hand, superconductors and magnetic materials may be considered to be poor thermal conductors not suitable to be used as materials of the radiation shield structure 320 and of the plate 317. In various embodiments, the materials of the radiation shield structure 320 and of the plate 317 may have either the same or different material composition. In some embodiments, a material of the radiation shield structure 320 and/or of the plate 317 may include a thermally conductive material having a thermal conductivity of at least about 50 Watt per meter Kelvin (W/m/K), e.g., at least about 200 W/m/K, or at least about 300 W/m/K, including all values and ranges therein. In some embodiments, a material of the radiation shield structure 320 and/or of the plate 317 may include a metal material, such as copper, including various copper alloys, e.g., high-purity copper (e.g., 99% pure copper, or 99.9% pure copper). In other embodiments, the metal material may be a zinc alloy or an aluminum alloy. Zinc alloys and aluminum alloys may advantageously have relatively low melting temperatures (under 700 degrees Celsius), enabling them to be cast into complex geometrical arrangements without requiring expensive and difficult high casting techniques, as would be conventionally required by metals having high melting temperatures (such as copper). Zinc alloys and aluminum alloys may also be advantageously inexpensive relative to conventional copper. In other embodiments, a material of the radiation shield structure 320 and/or of the plate 317 may include a thermal interface material (TIM), e.g., include a nickel-free gold plating on the plate of copper or another suitable material, for a better thermal interface. In various embodiments, the TIM may be, e.g., a TIM paste, or a thermally conductive epoxy (which may be a fluid when applied and may harden upon curing, as known in the art). In still other embodiments, a material of the radiation shield structure 320 and/or of the plate 317 may include stainless steel, silver, gold materials, including various alloys. The selection of an appropriate material for the material of the radiation shield structure 320 and/or of the plate 317 may depend on the selection of the materials for other components included in the quantum circuit assembly 300, in particular in the vicinity of the quantum circuit component 302 (e.g., within the radiation shield). To that end, for improved heat transfer, it may be desirable for the plate 317 of the filter module 310 to have a thermal conductivity that is higher than a thermal conductivity of other components included within the chamber 322 of the radiation shield structure 320. In some embodiments, a material of the radiation shield structure 320 and/or of the plate 317 could be annealed in order to increase the thermal conductivity.

In some embodiments, the plate 317 of the filter block 310 may be connected to ground during operation of the quantum circuit assembly 300. This may effectively serve as a shield conductor for each of the interconnects 315, similar to, e.g., coaxial or triaxial cables. However, the plate 317 of the filter block 310 may be well-thermalized and, therefore, may be seen as providing a silent environment, e.g., in terms of temperature of the electrons and phonons therein as well as other interference and noise signals.

Similar to the thermal contact between the radiation shield structure 320 and the filter module 310, in some embodiments, the connector 318 of the filter module 310 and the connector 306 provided over the support structure 304 may be such that, when they are connected, at least a portion of the filter module 310 is in thermal contact with at least a portion of the support structure 304, which may also be used to achieve a better thermal conductivity, leading to effectively lower temperatures in the quantum circuit assembly 300. For example, in some such embodiments, thermalization posts 303 may be provided over the support structure 304, so that the thermalization posts 303 could provide thermal contact between the filter module 310 and the support structure 304. In some embodiments, the thermal posts 303 and/or the support structure 304 may have thermal properties and include portions of materials described above with reference to the materials of the radiation field structure 320 and the plate 317.

As described above, although a single filter module 310 is illustrated in FIG. 16, in other embodiments, the quantum circuit assembly 300 may illustrate multiple such filter modules stacked over one another. Furthermore, in some embodiments, the quantum circuit assembly 300 may include different types of filter modules stacked over one another. An example of such an embodiment is shown in FIG. 18, illustrating a quantum circuit assembly 500. The quantum circuit assembly 500 may be seen as a further example of the quantum circuit assembly 300 where reference numerals that are the same as those used for the quantum circuit assembly 300 are used to represent the same or analogous components. In the interests of brevity, description of these components are not repeated with respect to the quantum circuit assembly 500 and, instead, only the differences are described. Furthermore, in order to not clutter the drawing, FIG. 18 does not use all of the reference numerals used in the illustration of the same/analogous components shown in FIG. 16 and FIG. 17.

In particular, FIG. 18 illustrates that, in some embodiments, in addition to the filter module 310, the quantum circuit assembly 500 may include a filter module 510, also included within the chamber 322. The filter module 510 may include a plate 517, which may be a plate in accordance with the considerations provided above with respect to the plate 317. The plate 517 may have one or more openings which realize interconnects 515 (surrounded in FIG. 18 by a dashed contour, similar to the notation of FIG. 16) with filters, similar to the interconnects 315, described above. Similar to an interconnect 315, an interconnect 515 may include a center conductor 511, a first connector 516, and a second connector 518. In particular, similar to the interconnect 315, an opening may extend between the first connector 516 and the second connector 518, with a center conductor 511 extending between, and electrically coupled to, the first connector 516 and the second connector 518 of the interconnect 515. In contrast to the interconnect 315, instead of including the dielectric material 313 that acts as a filter in the interconnect 315, the interconnect 515 may include a bandpass filter 513 configured to reflect at least some of unwanted frequencies back towards the (room temperature) source of the unwanted signal. For example, the center conductor 511 may be implemented on a structure, e.g., a PCB, configured to support propagation of a signal between the first connector 516 and the second connector 518, where the structure further includes the bandpass filter 513 configured to perform bandpass filtering on the signal propagated between the first connector 516 and the second connector 518. For example, the filter 513 may be implemented as an LC filter, e.g., a reflective LC filter, with the appropriate cut-off frequency for the interconnect of the dashed contour 360 (i.e., for a given cable 350). Such an LC filter may, e.g., be implemented as a surface mount component on a PCB, placed within the opening between the first connector 516 and the second connector 518 as to perform the desired bandpass filtering on the signal propagated over the center conductor 511.

In some embodiments, the filter module 510 may be included between the radiation shield structure 320 and the filter module 310, as shown in FIG. 18. In such embodiments, descriptions provided above with respect to electrical and thermal connectivity between the radiation shield structure 320 and the filter module 310 are applicable to electrical and thermal connectivity between the radiation shield structure 320 and the filter module 510 and, in the interests of brevity, are not repeated. Furthermore, descriptions provided above with respect to electrical and thermal connectivity between the radiation shield structure 320 and the filter module 310 are applicable to electrical and thermal connectivity between the filter module 510 and the filter module 310. Thus, in short, during operation of the quantum circuit assembly 500, the center conductors 351, 321, 511, and 311 may be electrically connected to one another to provide electrical connectivity between an external component and the quantum circuit component 302 within the chamber 322. Furthermore, the radiation shield structure 320, the plate 517, the plate 317, and the support structure 304 may be in thermal contact, allowing to realize a low-energy photon environment in the chamber 322. Furthermore, the radiation shield structure 320, the filter modules 510 and 310 and the support structure may be connected with each other by means of additional fasteners (not shown in the schematic).

Example Devices and Systems

Quantum circuit components that may be integrated with one or more filter modules (e.g., stackable in-line filter modules such as filter modules 310 and/or 510, described herein) such that both the quantum circuit component and the one or more filter modules are at least partially inside a chamber formed by a radiation shield structure, as described above, may be implemented using any kind of qubit devices or included in any kind of quantum processing devices/structures. Some examples of such devices/structures are illustrated in FIGS. 19A-19B, 20, and 21.

Figure 19B:
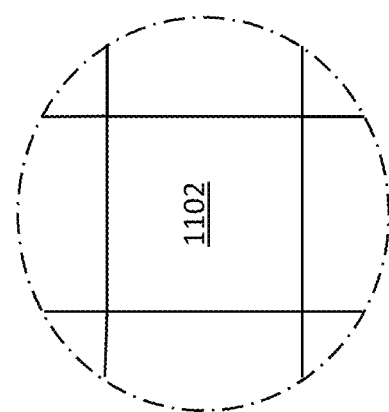
FIGS. 19A and 19B are top views of a wafer and dies that may include one or more of qubit devices disclosed herein.
Figure 19A:
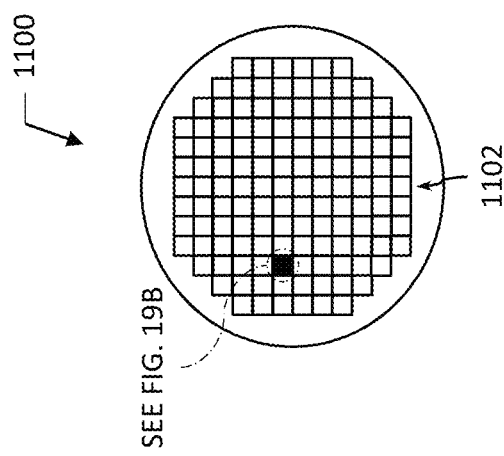

FIGS. 19A-19B are top views of a wafer 1100 and dies 1102 that may be formed from the wafer 1100, according to some embodiments of the present disclosure. The dies 1102 may include any of the qubit devices disclosed herein, e.g. the qubit devices described with reference to FIGS. 1-15, any further embodiments of such qubit devices as described herein, or any combinations of such qubit devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component, e.g., the quantum circuit component 302 as described herein. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 21) or other logic that is configured to store information in the memory devices or execute instructions stored in the memory array.

Figure 20:
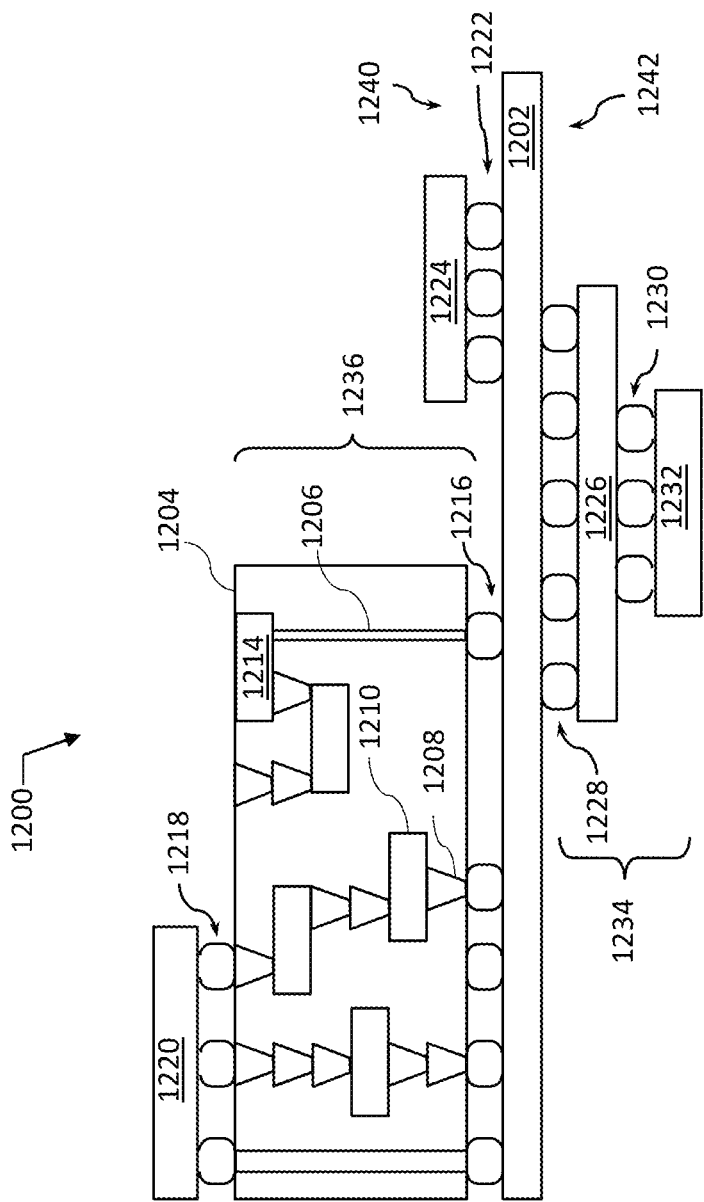
FIG. 20 is a cross-sectional side view of a device assembly that may include one or more of qubit devices disclosed herein.

FIG. 20 is a cross-sectional side view of a device assembly 1200 that may be included in any of the embodiments of the quantum circuit components disclosed herein. For example, in various embodiments, the device assembly 1200 may be included in, or may include, the quantum circuit component 302. In general, the device assembly 1200 may be integrated within a package of an integrated quantum circuit assembly for inclusion within a system, e.g., within a cooling apparatus, where the device assembly 1200 is integrated with one or more filter modules such that both the quantum circuit component and the one or more filter modules are at least partially inside a chamber formed by a radiation shield structure, as described herein. The device assembly 1200 may include a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 20 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 20), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 20, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g. a package including any of the qubit devices disclosed herein, e.g. the qubit devices described with reference to FIGS. 1-15, any further embodiments of such qubit devices as described herein, or any combinations of such qubit devices; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 20, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220.

The package 1224 may be a package including any qubit devices disclosed herein, e.g. the qubit devices described with reference to FIGS. 1-15, any further embodiments of such qubit devices as described herein, or any combinations of such qubit devices; or may be a conventional IC package, for example. In some embodiments, the package 1224 may take the form of any of the embodiments of the quantum circuit component 302 to be integrated within a package of an integrated quantum circuit assembly for inclusion within a cooling apparatus as described herein.

The device assembly 1200 illustrated in FIG. 20 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 21:
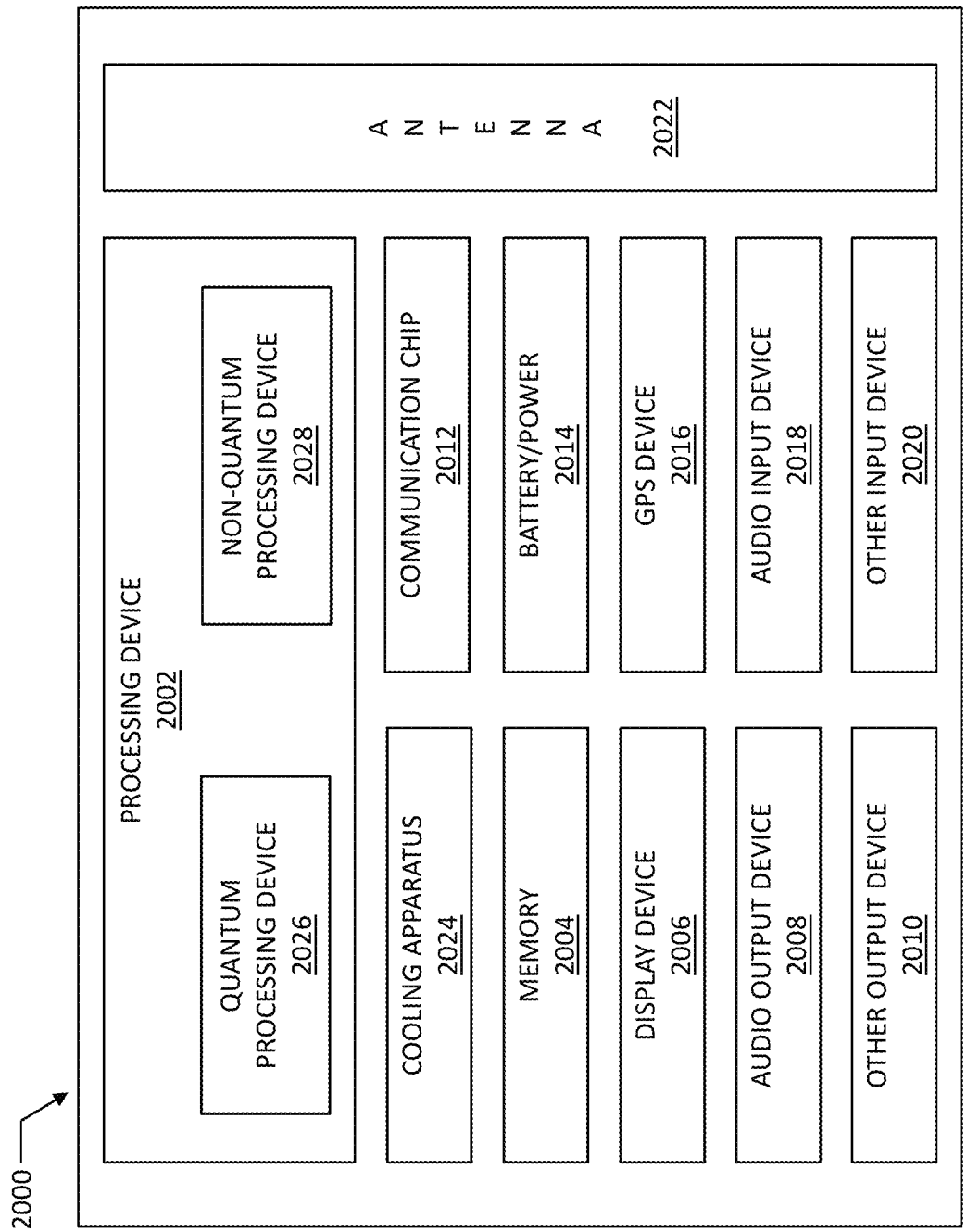
FIG. 21 is a block diagram of an example quantum computing device that may include one or more of qubit devices integrated with stackable in-line filter modules disclosed herein, in accordance with various embodiments.

FIG. 21 is a block diagram of an example quantum computing device 2000 that may include any of the qubit devices integrated with stackable in-line filter modules disclosed herein, e.g. the qubit devices described with reference to FIGS. 1-15, any further embodiments of such qubit devices as described herein, or any combinations of such qubit devices. A number of components are illustrated in FIG. 21 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 21, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030, and may instead operate at room temperature. In some embodiments, the cooling apparatus 2024 may be the cooling apparatus 400 in which an integrated quantum circuit assembly, e.g., any of the embodiments of the quantum circuit assemblies 300 or 500, as described herein, may be included.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). In various embodiments, the quantum processing device 2026 may include, or be included in, any of the quantum circuit components disclosed herein, e.g. one or more of the quantum circuit components 302 with any of the qubit devices disclosed herein, e.g. the qubit devices described with reference to FIGS. 1-15, any further embodiments of such qubit devices as described herein, or any combinations of such qubit devices. At least some of the one or more of the quantum circuit components 302 of the quantum processing device 2026 may be integrated with stackable in-line filter modules as described herein. In some embodiments, the quantum processing device 2026 may perform data processing by performing operations on the qubits that may be generated in the quantum circuit components 302, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

SELECT EXAMPLES

The following paragraphs provide examples of various ones of the embodiments disclosed herein.

Example 1 provides a filter module for a quantum circuit component, the filter module including a plate for housing a filter. The plate includes a first connector, a second connector, and an opening extending between the first connector and the second connector, the opening including a center conductor extending between, and electrically coupled to, the first connector and the second connector, and further including a filter configured to convert radio frequency (RF) energy to heat (i.e., the filter is configured to attenuate electromagnetic interference by converting RF energy to heat). The first connector is configured to provide electrical coupling between a first end of the center conductor of the opening and a cable configured to enable propagation of electrical signals between an external electronic component and the quantum circuit component having at least one qubit device. The second connector is configured to provide electrical coupling between a second end of the center conductor of the opening (the second end being different from the first end) and the quantum circuit component.

Example 2 provides the filter module according to example 1, where the filter includes a filter material (e.g., an epoxy material and/or another material absorptive at RF frequencies, such as copper powder) configured to convert the RF energy to heat, the filter material at least partially surrounding at least a portion of the center conductor of the opening.

Example 3 provides the filter module according to examples 1 or 2, where a cross-section of the opening is substantially circular and a diameter of the cross-section of the opening is between about 0.05 and 10 millimeters, e.g., between about 0.1 and 7 millimeters, or between about 3 and 5 millimeters, including all values and ranges therein.

Example 4 provides the filter module according to any one of the preceding examples, where a length of the center conductor of the opening is between about 0.5 and 50 millimeters, e.g., between about 1 and 20 millimeters, or between about 3 and 10 millimeters, including all values and ranges therein. In some embodiments, the diameter of the center conductor of the opening may be between about 0.3 and 3 millimeters, e.g., between about 0.3 and 2 millimeters, or between about 0.5 and 1 millimeters, including all values and ranges therein.

Example 5 provides the filter module according to any one of the preceding examples, where the plate includes (e.g., is formed of) a thermally conductive material having a thermal conductivity of at least about 50 Watt per meter Kelvin (W/m/K), e.g., at least about 200 W/m/K, or at least about 300 W/m/K, including all values and ranges therein.

Example 6 provides the filter module according to any one of the preceding examples, where, during operation of the quantum circuit component, the plate is configured to be in thermal contact with a radiation shield that at least partially surrounds the quantum circuit component and the filter module, and a surface area of the plate that is in thermal contact with the radiation shield is at least about 300 or 400 square millimeters, e.g., at least about 1000 square millimeters, or at least about 1200 square millimeters, including all values and ranges therein.

Example 7 provides the filter module according to any one of examples 1-6, where the center conductor of the opening is configured to support provision of a direct current (DC) from the electronic component to the at least one qubit device.

Example 8 provides the filter module according to any one of examples 1-6, where the at least one qubit device includes at least one quantum dot qubit device that includes at least one plunger gate, and the center conductor of the opening is configured to support provision, from the electronic component, of at least one plunger voltage to be applied to the at least one plunger gate to control formation of one or more quantum dots in the at least one qubit device.

Example 9 provides the filter module according to any one of examples 1-6, where the at least one qubit device includes at least one quantum dot qubit device that includes two or more plunger gates and a barrier gate, and the center conductor of the opening is configured to support provision, from the electronic component, of at least one barrier voltage to be applied to the barrier gate to control a potential barrier between two adjacent plunger gates of the two or more plunger gates.

Example 10 provides the filter module according to any one of examples 1-6, where the at least one qubit device includes at least one quantum dot qubit device that includes at least one plunger gate, at least one barrier gate, and at least one accumulation gate, and the center conductor of the opening is configured to support provision, from the electronic component, of at least one barrier voltage to be applied to the at least one barrier gate to control a potential barrier between the at least one plunger gate and an adjacent one of the at least one accumulation gate.

Example 11 provides the filter module according to any one of examples 1-6, where the at least one qubit device includes at least one quantum dot qubit device that includes at least one accumulation gate, and the center conductor of the opening is configured to support provision, from the electronic component, of at least one accumulation voltage to be applied to the at least one accumulation gate to control a number of charge carriers in an area between an area where one or more quantum dots are to be formed and a charge carrier reservoir.

Example 12 provides the filter module according to any one of examples 1-6, where the at least one qubit device includes at least one superconducting qubit device that includes at least one flux bias line, and the center conductor of the opening is configured to support provision of a current from the electronic component to the at least one flux bias line.

Example 13 provides the filter module according to any one of examples 1-6, where the at least one qubit device includes at least one superconducting qubit device that includes at least one microwave drive line, and the center conductor of the opening is configured to support provision of a current from the electronic component to the at least one microwave drive line.

Example 14 provides a radiation shield arrangement for a quantum circuit component, the arrangement including a radiation shield structure and mechanical attachment means. The radiation shield structure is configured to at least partially surround the quantum circuit component having at least one qubit device (e.g., the structure may form a chamber into which the quantum circuit component may be placed) and to attenuate electromagnetic radiation incident on (e.g., in the vicinity of) the quantum circuit component. The mechanical attachment means are configured to secure the quantum circuit component at a location where the quantum circuit component is at least partially surrounded by the radiation shield structure. The radiation shield structure includes a first connector and a second connector. The radiation shield structure further includes an opening extending between the first connector and the second connector. The opening includes a center conductor extending between, and electrically coupled to, the first connector and the second connector. The opening further includes a dielectric material (e.g., Teflon) surrounding the center conductor (e.g., the opening in the radiation shield structure may, at least partially, be filled with the dielectric material). The first connector of the opening is configured to provide electrical coupling between a first end of the center conductor of the opening and a cable configured to enable propagation of electrical signals between an external electronic component and the quantum circuit component. The second connector of the opening is configured to provide electrical coupling between a second end of the center conductor of the opening (the second end being different from the first end) and the quantum circuit component.

Example 15 provides the radiation shield arrangement according to example 14, where the cable is a coaxial or a triaxial cable including a center conductor and at least one ground shield conductor surrounding the center conductor of the cable, the first connector is configured to provide electrical coupling between the first end of the center conductor of the opening and the cable by electrically coupling the center conductor of the opening to the center conductor of the cable, and the at least one ground shield conductor abuts the first connector and does not continue into the opening of the radiation shield structure.

Example 16 provides the radiation shield arrangement according to examples 14 or 15, where at least a portion of a surface of the radiation shield structure that faces the quantum circuit component is covered with a material configured to absorb infrared radiation.

Example 17 provides the radiation shield arrangement according to any one of examples 14-16, further including a filter module, where the radiation shield structure is configured to at least partially surround the filter module and to attenuate electromagnetic radiation incident on (e.g., in the vicinity of) the filter module. The filter module includes a plate for housing a filter, the plate includes a first connector, a second connector, and an opening extending between the first connector and the second connector of the plate. The opening of the plate includes a center conductor extending between, and electrically coupled to, the first connector and the second connector. The opening of the plate further includes a filter configured to convert radio frequency (RF) energy to heat (i.e., the filter is configured to attenuate electromagnetic interference by converting RF energy to heat). The first connector of the plate is configured to provide electrical coupling between a first end of the center conductor of the opening of the plate and the second connector of the radiation shield structure. The second connector of the plate is configured to provide electrical coupling between a second end of the center conductor of the opening of the plate (the second end being different from the first end) and the quantum circuit component.

In further examples, the filter module of example 17 may be a filter module according to any one of examples 1-13.

Example 18 provides the radiation shield arrangement according to any one of examples 14-17, further including a bandpass filter module (where, as used herein, the term "bandpass filter" is intended to include low-pass and high-pass filters because those filters filter low and high bands, respectively, and therefore, may be referred to as "bandpass" filters), where the radiation shield structure is configured to at least partially surround the bandpass filter module and to attenuate electromagnetic radiation incident on (e.g., in the vicinity of) the bandpass filter module. The bandpass filter module includes a plate (e.g., a PCB) for housing a bandpass filter, the plate including a first connector, a second connector, and an opening extending between the first connector and the second connector of the plate, the opening of the plate including a structure configured to support propagation of a signal between the first connector and the second connector of the plate, and further including a bandpass filter configured to perform bandpass filtering on the signal propagated between the first connector and the second connector of the plate. The first connector of the plate is configured to provide electrical coupling between the second connector of the radiation shield structure and the structure configured to support propagation of the signal between the first connector and the second connector of the plate. The second connector of the plate is configured to provide electrical coupling between the quantum circuit component and the structure configured to support propagation of the signal between the first connector and the second connector of the plate.

Example 19 provides a quantum circuit assembly that includes a package that includes a plurality of components that are integral (i.e., included as a part of a whole, rather than supplied separately) to the package. The quantum circuit assembly further includes mechanical attachment means for securing the package within a cryogenic chamber of a cooling apparatus (e.g., a cryogenic refrigeration system such as a dilution refrigerator). The plurality of components include a quantum circuit component, the quantum circuit component having at least one qubit device, a radiation shield structure including a chamber configured to at least partially surround the quantum circuit component and to attenuate electromagnetic radiation incident on (e.g., in the vicinity of) the quantum circuit component, and a filter module included within the chamber and configured to convert radio frequency (RF) energy to heat (i.e., the filter is configured to attenuate electromagnetic interference by converting RF energy to heat).

In further examples, instead of or in addition to the filter module that is configured to convert RF energy to heat, the quantum circuit assembly according to examples 19 or 20 may include a filter module configured to reflect at least some of unwanted frequencies back.

Example 20 provides the quantum circuit assembly according to example 19, where the radiation shield structure includes a feedthrough connector configured to couple a cable configured to enable propagation of electrical signals between an external electronic component and the quantum circuit component. The filter module includes a plate for housing a filter, the plate including a first connector, a second connector, and an opening extending between the first connector and the second connector of the plate, the opening of the plate including a center conductor extending between, and electrically coupled to, the first connector and the second connector, and further including a filter configured to convert radio frequency (RF) energy to heat. The first connector of the plate is configured to provide electrical coupling between a first end of the center conductor of the opening of the plate and the feedthrough connector. The second connector of the plate is configured to provide electrical coupling between a second end of the center conductor of the opening of the plate (the second end being different from the first end) and the quantum circuit component.

In further examples, the filter module of examples 19 or 20 may be a filter module according to any one of examples 1-13.

In further examples, the radiation shield structure of examples 19 or 20 may be a radiation shield structure according to any one of examples 14-18.

Example 21 provides a quantum computer that includes one or more of: 1) a filter module according to any one of examples 1-13, 2) a radiation shield structure according to any one of examples 14-18, and 3) a quantum circuit assembly according to claims 19-20.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A filter module for a quantum circuit component, the filter module comprising:
    a plate comprising a first connector, a second connector, and a center conductor in an opening between the first connector and the second connector; and
    a filter to convert radio frequency (RF) energy to heat, wherein the filter is in the opening.

2. The filter module according to claim 1, wherein the filter includes a material to convert the RF energy to heat, the material at least partially surrounding at least a portion of the center conductor.

3. The filter module according to claim 1, wherein a cross-section of the opening is substantially circular and a diameter of the cross-section of the opening is between 0.05 and 10 millimeters.

4. The filter module according to claim 1, wherein a length of the center conductor is between 0.5 and 50 millimeters.

5. The filter module according to claim 1, wherein the plate includes a material having a thermal conductivity of at least 50 Watt per meter Kelvin.

6. The filter module according to claim 1, wherein:
    during operation of the quantum circuit component, the plate is to be in thermal contact with a radiation shield that at least partially surrounds the quantum circuit component and the filter module, and
    a surface area of the plate that is in thermal contact with the radiation shield is at least 300 square millimeters.

7. The filter module according to claim 1, wherein the first connector is to couple the center conductor to an electronic component, and wherein the center conductor is to support provision of a direct current (DC) signal from the electronic component to at least one qubit device of the quantum circuit component.

8. The filter module according to claim 1, wherein:
    the first connector is to couple the center conductor to an electronic component,
    the quantum circuit component includes a quantum dot qubit device that includes a plunger gate, and
    the center conductor is to support provision, from the electronic component, of a plunger voltage to be applied to the plunger gate to control formation of one or more quantum dots in the quantum dot qubit device.

9. The filter module according to claim 1, wherein:
    the first connector is to couple the center conductor to an electronic component,
    the quantum circuit component includes a quantum dot qubit device that includes two or more plunger gates and a barrier gate, and the center conductor is to support provision, from the electronic component, of a barrier voltage to be applied to the barrier gate to control a potential barrier between two adjacent plunger gates of the two or more plunger gates.

10. The filter module according to claim 1, wherein:
the first connector is to couple the center conductor to an electric component,
the quantum circuit component includes a quantum dot qubit device that includes a plunger gate, a barrier gate, and an accumulation gate, and
the center conductor is to support provision, from the electronic component, of barrier voltage to be applied to the barrier gate to control a potential barrier between the plunger gate and the accumulation gate.

11. The filter module according to claim 1, wherein:
the first connector is to couple the center conductor to an electronic component,
the quantum circuit component includes a quantum dot qubit device that includes an accumulation gate, and
the center conductor is to support provision, from the electronic component, of an accumulation voltage to be applied to the accumulation gate to control a number of charge carriers in an area between a change carrier reservoir and an area where one or more quantum dots are to be formed.

12. The filter module according to claim 1, wherein:
the first connector is to couple the center conductor to an electronic component,
the quantum circuit component includes a superconducting qubit device that includes a flux bias line, and
the center conductor is to support provision of a current from the electronic component to the a flux bias line.

13. The filter module according to claim 1, wherein:
the first connector is to couple the center conductor to an elecronic component,
the quantum circuit component includes a superconducting qubit device that includes a microwave drive line, and
the center conductor is to support provision of a current from the electronic component to the microwave drive line.

14. The filter module according to claim 1, wherein the first connector is to provide electrical coupling between a cable and an end of the center conductor in the opening.

15. The filter module according to claim 14, wherein the cable is to enable propagation of electrical signals between an electronic component and the quantum circuit component.

16. The filter module according to claim 14, wherein the end is a first end, and wherein the second connector is to provide electrical coupling between the quantum circuit component and a second end of the center conductor in the opening.

17. A quantum circuit assembly, comprising:
a radiation shield structure comprising a chamber;
a quantum circuit component comprising a qubit device, wherein the quantum circuit component is in the chamber; and
a filter module in the chamber, the filter module comprising:
a plate comprising a first connector, a second connector, and a center conductor in an opening between the first connector and the second connector, and
a filter to convert radio frequency (RF) energy to heat, wherein the filter is in the opening.

18. The quantum circuit assembly according to claim 17, wherein the radiation shield structure is to attenuate electromagnetic radiation incident on the quantum circuit component.

19. The quantum circuit assembly according to claim 17, further comprising attachment means for securing the quantum circuit assembly within a cooling apparatus.

20. The quantum circuit assembly according to claim 17, further comprising a package, wherein the radiation shield structure, the quantum circuit component, and the filter module are integral to the package.

* * * * *

UNITED STATES PATENT AND TRADEMARK OFFICE
CERTIFICATE OF CORRECTION

| | |
|---|---|
| PATENT NO. | : 11,957,066 B2 |
| APPLICATION NO. | : 16/560184 |
| DATED | : April 9, 2024 |
| INVENTOR(S) | : Florian Luthi et al. |

It is certified that error appears in the above-identified patent and that said Letters Patent is hereby corrected as shown below:

On the Title Page

On Page 2, in Item (56), under "Other Publications", in Column 5, Line 41, delete ""Ultafast high-fidelity" and insert -- Ultrafast high-fidelity --, therefor.

In the Claims

In Column 45, Claim 10, Line 8, delete "elecronic component," and insert -- electronic component, --, therefor.

In Column 45, Claim 11, Line 24, delete "change carrier" and insert -- charge carrier --, therefor.

In Column 45, Claim 12, Line 33, delete "to the a" and insert -- to the --, therefor.

In Column 45, Claim 13, Line 36, delete "elecronic component," and insert -- electronic component, --, therefor.

Signed and Sealed this
Fourteenth Day of May, 2024

Katherine Kelly Vidal
*Director of the United States Patent and Trademark Office*